(12) United States Patent
Horikawa

(10) Patent No.: US 7,790,613 B2
(45) Date of Patent: Sep. 7, 2010

(54) SEMICONDUCTOR DEVICE AND METHOD OF MANUFACTURING THE SAME

(75) Inventor: Mitsuhiro Horikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 88 days.

(21) Appl. No.: 12/021,113

(22) Filed: Jan. 28, 2008

(65) Prior Publication Data

US 2008/0210999 A1 Sep. 4, 2008

(30) Foreign Application Priority Data

Jan. 31, 2007 (JP) ............................. 2007-020922

(51) Int. Cl.
*H01L 21/469* (2006.01)
*H01L 21/31* (2006.01)

(52) U.S. Cl. .................. 438/672; 257/411; 438/763

(58) Field of Classification Search ............... 257/296, 257/E21.646, E27.084, 411; 438/239, 672, 438/763
See application file for complete search history.

(56) References Cited

U.S. PATENT DOCUMENTS

| | | | | |
|---|---|---|---|---|
| 5,258,332 A | * | 11/1993 | Horioka et al. | 438/389 |
| 5,376,590 A | * | 12/1994 | Machida et al. | 438/763 |
| 5,512,513 A | * | 4/1996 | Machida et al. | 438/624 |
| 5,811,872 A | * | 9/1998 | Machida et al. | 257/635 |
| 6,335,278 B1 | * | 1/2002 | Miyazaki | 438/660 |
| 6,828,242 B2 | * | 12/2004 | Kujirai et al. | 438/706 |
| 7,224,034 B2 | * | 5/2007 | Kujirai et al. | 257/411 |
| 7,303,946 B1 | | 12/2007 | Ozawa et al. | |
| 2003/0017669 A1 | | 1/2003 | Kiyotoshi et al. | |
| 2005/0037570 A1 | * | 2/2005 | Sandhu | 438/253 |
| 2007/0187783 A1 | * | 8/2007 | Kujirai et al. | 257/411 |

FOREIGN PATENT DOCUMENTS

| | | |
|---|---|---|
| JP | 2003-31689 A | 1/2003 |
| JP | 2003-243334 A | 8/2003 |
| JP | 2003-243534 A | 8/2003 |
| JP | 2004-260203 A | 9/2004 |

OTHER PUBLICATIONS

Aray J.J. Huang et al., "Feature of High Aspect Ratio Elliptic-contact Etch", Proceedings of International Symposium on Dry Process, pp. 263-264, the Institue of Electrical Engineers of Japan, 2006.

Aray J.J. Huang et al., "Feature of High Aspect Ratio Elliptic-contact Etch", Proceedings of International Symposium on Dry Process, pp. 263-264, the Institue of Electrical Engineers of Japan.

* cited by examiner

*Primary Examiner*—Jarrett J Stark
*Assistant Examiner*—Nicholas Tobergte
(74) *Attorney, Agent, or Firm*—Sughrue Mion, PLLC

(57) ABSTRACT

A semiconductor device includes: a semiconductor substrate; a memory cell selection transistor that is formed on the semiconductor substrate and has a source and a drain; a contact plug; a polysilicon interlayer film that is formed above the memory cell selection transistor and has a cylinder-shaped through-hole; and a storage capacity part that is formed in the through-hole and is connected to the source and the drain of the memory cell selection transistor via the contact plug, wherein a boundary between a bottom and a side wall of the through-hole has a curved surface.

8 Claims, 27 Drawing Sheets

SEMICONDUCTOR DEVICE AND METHOD OF MANUFACTURING THE SAME

Priority is claimed on Japanese Patent Application No. 2007-20922, filed Jan. 31, 2007, the contents of which are incorporated herein by reference.

BACKGROUND OF THE INVENTION

1. Field of the Invention

The present invention relates to a semiconductor device and a method of manufacturing the same, and more particularly, to a semiconductor device including a capacitor, and a method of manufacturing the same.

2. Description of the Related Art

In recent years, large scale integration circuits (LSIs), each of which has a plurality of MOS transistors and resistors integrated on a single chip, have been employed for main parts of computers or electric equipment.

Among LSIs, devices such as DRAMs (Dynamic Random Access Memories) have been rapidly decreased in size. DRAMs include capacitors for storing charges. A structure of a capacitor of DRAM and a method of manufacturing the capacitor are disclosed in, for example, Japanese Unexamined Patent Application, First Publication No. 2003-243534.

As disclosed in Japanese Unexamined Patent Application, First Publication No. 2003-243534, after MISFET for memory cell selection is formed on a semiconductor substrate, a capacitor interlayer insulating film including a silicon nitride film and an insulating film is formed. A silicon oxide film is used for the insulating film of the capacitor interlayer insulating film. The silicon oxide film is formed by a plasma CVD method using ozone ($O_3$) and tetraethoxysilane (TEOS) as reaction gases. Next, a groove (hole) is formed in the capacitor interlayer insulating film to expose a plug of the memory cell selection MISFET. For example, the groove (hole) is formed by an etching process using a photoresist film as a mask. A capacitor is formed by forming a bottom electrode film, a capacitive insulating film and a top electrode film in order in the formed groove (hole). The bottom electrode film, the capacitive insulating film and the top electrode film are mainly formed by a CVD method.

For the silicon oxide film of the capacitor interlayer insulating film, when the hole is formed by the etching process using the photoresist film as the mask, it is assumed that the section of the formed hole is tapered down. Such a shape of the hole is disclosed in, for example, "A. J. J. Huang, et al, in Proceedings of International Symposium on Dry Process 2006 (The Institute of Electrical Engineers of Japan), p. 263-264."

However, when the bottom electrode film, the capacitive insulating film and the top electrode film are to be formed in the taper-shaped hole using the CVD method, it is difficult to supply a reaction gas throughout the inside of the hole, particularly into the bottom of the hole, which may result in difficulty in obtaining a uniform film. Specifically, there may occur a portion in which an electrode film or the like is not formed, which may result in lowering of coverage of the electrode film or the like for the inner side of the hole. In addition, there may be a high possibility of local irregularity of film thickness (partially thin film) and poor film quality, which may result in an increase of leakage current of the capacitor and failure to attain high reliability.

SUMMARY OF THE INVENTION

The present invention has been made to overcome the above problems, and it is an object of the present invention to provide a semiconductor device with high reliability, which is capable of reducing leakage current of a capacitor by increasing coverage of an electrode film or the like for an inner side of a hole and increasing regularity of the electrode film or the like, and a method of manufacturing the same.

To accomplish the above object, the present invention provides the following configurations.

(1) The present invention provides a semiconductor device including: a semiconductor substrate; a memory cell selection transistor that is formed on the semiconductor substrate and has a source and a drain; a contact plug; a polysilicon interlayer film that is formed above the memory cell selection transistor and has a cylinder-shaped through-hole; and a storage capacity part that is formed in the through-hole and is connected to the source and the drain of the memory cell selection transistor via the contact plug, wherein a boundary between a bottom and a side wall of the through-hole has a curved surface.

According to the semiconductor device of the present invention, since the boundary between the bottom and the side wall of the through-hole provided in the polysilicon interlayer film has the curved surface, the storage capacity part is formed into a shape that fits the inner side of the through-hole including the curved boundary. Accordingly, it is possible to reduce leakage current of the storage capacity part as compared to when the boundary between the bottom and the side wall of the through-hole has an angled shape, thereby providing a semiconductor device having high reliability.

In addition, since the polysilicon interlayer film can be formed with the through-hole having the aspect ratio higher than that of a conventional silicon oxide interlayer film, there is little possibility of short-circuit between adjacent through-holes and hence between storage capacity parts. The formation of the through-hole having the high aspect ratio in the polysilicon interlayer film can be achieved because: an etching rate of the polysilicon interlayer film in the diameter direction of the through-hole is slower than that of the conventional silicon oxide film; and a uniformed etching expansion in the through-hole in the diameter direction can be obtained; and thereby a so-called bowing problem can be avoided.

According to the semiconductor device of the present invention, coverage and uniformity of an electrode film and the like for the inner side of the through-hole are improved, thereby reducing leakage current of a capacitor and thus providing a semiconductor device having high reliability.

(2) In the semiconductor device of the present invention, the side wall of the through-hole may be covered by a silicon nitride insulating film or a silicon oxide insulating film.

With this configuration, the insulating property of the storage capacity part can be enhanced, thereby preventing loss of electrostatic capacity. In addition, this insulating film can prevent constituent material of the storage capacity part from being diffused into the polysilicon interlayer film.

(3) In the semiconductor device of the present invention, the contact plug may include at least one of Ru, Ir and W.

With this configuration, contact resistance between the contact plug and the storage capacity part can be decreased, thereby increasing electrostatic capacity thereof (4) In the semiconductor device of the present invention, a boundary between the side wall of the through-hole and a top of the polysilicon interlayer film may have a curved surface.

With this configuration, leakage current of the storage capacity part can be further reduced, thereby providing a semiconductor device having higher reliability.

In the semiconductor device of the present invention, the storage capacity part may include a bottom electrode film laminated on the bottom and the side wall of the through-hole, a dielectric film laminated on the bottom electrode film, and a top electrode film laminated on the dielectric film.

With this configuration, as the bottom electrode film, the dielectric film and the top electrode film are formed into the shape of the inner side of the through-hole having the curved surface, thickness and film quality of the bottom electrode film, the dielectric film and the top electrode film become uniform, and accordingly, coverage of the bottom electrode film, the dielectric film and the top electrode film for the inner side of the through-hole is improved, thereby reducing leakage current of the storage capacity part and thus providing a semiconductor device having high reliability.

In the semiconductor device of the present invention, the storage capacitive part may be connected to the contact plug by contacting the contact plug with the bottom electrode film in the bottom of the through-hole.

In the semiconductor device of the present invention, the contact plug may include one of Ru, Ir, W and an alloy thereof, and a surface of the through-hole of the contact plug may include an oxide of one of Ru, Ir and W, or a complex oxide thereof.

(5) In addition, the present invention provides a method of manufacturing a semiconductor device, including the steps of: forming at least a polysilicon interlayer film above a memory cell selection transistor that is formed on a semiconductor substrate and has a contact plug connected to a source and a drain; forming a cylinder-shaped through-hole in the polysilicon interlayer film to expose the contact plug and shaping a boundary surface between a bottom and a side wall of the through-hole into a curve; and forming a storage capacity part in the inner side of the through-hole, the storage capacity part being connected to the contact plug.

According to the method of manufacturing the semiconductor device of the present invention, since the boundary between the bottom and the side wall of the through-hole provided in the polysilicon interlayer film is shaped in the curve, the storage capacity part is formed into the shape of the inner side of the through-hole having the curved surface. Accordingly, it is possible to reduce leakage current of the storage capacity part as compared to when the boundary between the bottom and the side wall of the through-hole has an angled shape, thereby providing a semiconductor device having high reliability.

In addition, since the polysilicon interlayer film can be formed with the through-hole having the aspect ratio higher than that of a conventional silicon oxide interlayer film, there is little possibility of short-circuit occurring between adjacent through-holes and hence between storage capacity parts. In addition, the formation of the through-hole having the high aspect ratio in the polysilicon interlayer film allows uniform expansion of the through-hole in the diameter direction since an etching rate of the through-hole in the polysilicon interlayer film in the diameter direction is lower than that of the conventional silicon oxide film, thereby avoiding a so-called bowing problem.

According to the method of manufacturing the semiconductor device of the present invention, coverage and uniformity of an electrode film and so on for the inner side of the through-hole are improved, thereby reducing leakage current of a capacitor and thus providing a semiconductor device having high reliability.

(6) In the method of manufacturing the semiconductor device of the present invention, in the step of forming the through-hole, the boundary surface between the bottom and the side wall of the through-hole may be shaped in the curve by annealing the polysilicon interlayer film, in a hydrogen atmosphere or in an inert gas atmosphere.

According to the method of manufacturing the semiconductor device of the present invention, in the through-hole forming process, as the polysilicon interlayer film is annealed in the hydrogen atmosphere or the inert gas atmosphere, migration of silicon atoms contained in the polysilicon interlayer film is accelerated, thereby easily shaping the boundary of the through-hole into the curve. Accordingly, leakage current of the storage capacity part can be reduced, thereby providing a semiconductor device having high reliability.

(7) In the method of manufacturing the semiconductor device of the present invention, in the step of forming the through-hole, the side wall of the through-hole may be covered by a silicon nitride insulating film or a silicon oxide insulating film.

According to the method of manufacturing the semiconductor device of the present invention, the insulating property of the storage capacity part can be enhanced, thereby preventing loss of electrostatic capacity. In addition, this insulating film can prevent constituent material of the storage capacity part to be formed later from being diffused into the polysilicon interlayer film.

(8) In the method of manufacturing the semiconductor device of the current invention, the contact plug may include at least one of Ru, Ir, W or an alloy thereof According to the method of manufacturing the semiconductor device of the present invention, the insulating property of the storage capacity part can be enhanced, thereby preventing loss of electrostatic capacity, and contact resistance between the contact plug and the storage capacity part can be decreased, thereby increasing electrostatic capacity.

In the method of manufacturing the semiconductor device of the present invention, in the step of forming the through-hole, a boundary between the side wall of the through-hole and the top of the polysilicon interlayer film may be shaped in a curve.

According to the method of manufacturing the semiconductor device of the present invention, leakage current of the storage capacity part can be further reduced, thereby providing a semiconductor device having higher reliability.

In the method of manufacturing the semiconductor device of the present invention, a silicon oxide film for antioxidation may be formed on the polysilicon interlayer film.

According to the method of manufacturing the semiconductor device of the present invention, the polysilicon interlayer film is prevented from being oxidized, and volume change caused by oxidation of the polysilicon interlayer film becomes small to maintain the thickness of the polysilicon interlayer film. Accordingly, a planarization treatment for the polysilicon interlayer film is not required when a mask or the like is laminated on the polysilicon interlayer film, thereby stably performing the through-hole forming process and the storage capacity part forming process.

In the method of manufacturing the semiconductor device of the present invention, a silicon nitride interlayer film may be formed on the polysilicon interlayer film at a side of the semiconductor substrate.

According to the method of manufacturing the semiconductor device of the present invention, the silicon nitride interlayer film can be used as an etching stopper in the formation of the through-hole.

In the method of manufacturing the semiconductor device of the present invention, a through-hole may be formed in the polysilicon interlayer film using the silicon nitride interlayer film as an etching stopper, a boundary between a bottom and a side wall of the through-hole may be shaped into a curve, and then, the contact plug may be exposed by anisotropic-etching the bottom (silicon nitride interlayer film) of the through-hole.

In the method of manufacturing the semiconductor device of the present invention, a preliminary through-hole may be formed in the polysilicon interlayer film using the silicon nitride interlayer film as an etching stopper, a boundary between a bottom and a side wall of the preliminary through-hole may be shaped into a curve, at least the side wall of the preliminary through-hole may be covered by a silicon nitride insulating film or a silicon oxide insulating film, and then, the contact plug may be exposed by anisotropic-etching the bottom of the preliminary through-hole to form a through-hole.

DETAILED DESCRIPTION OF THE INVENTION (Semiconductor Device of First Embodiment)

Figure 1A:
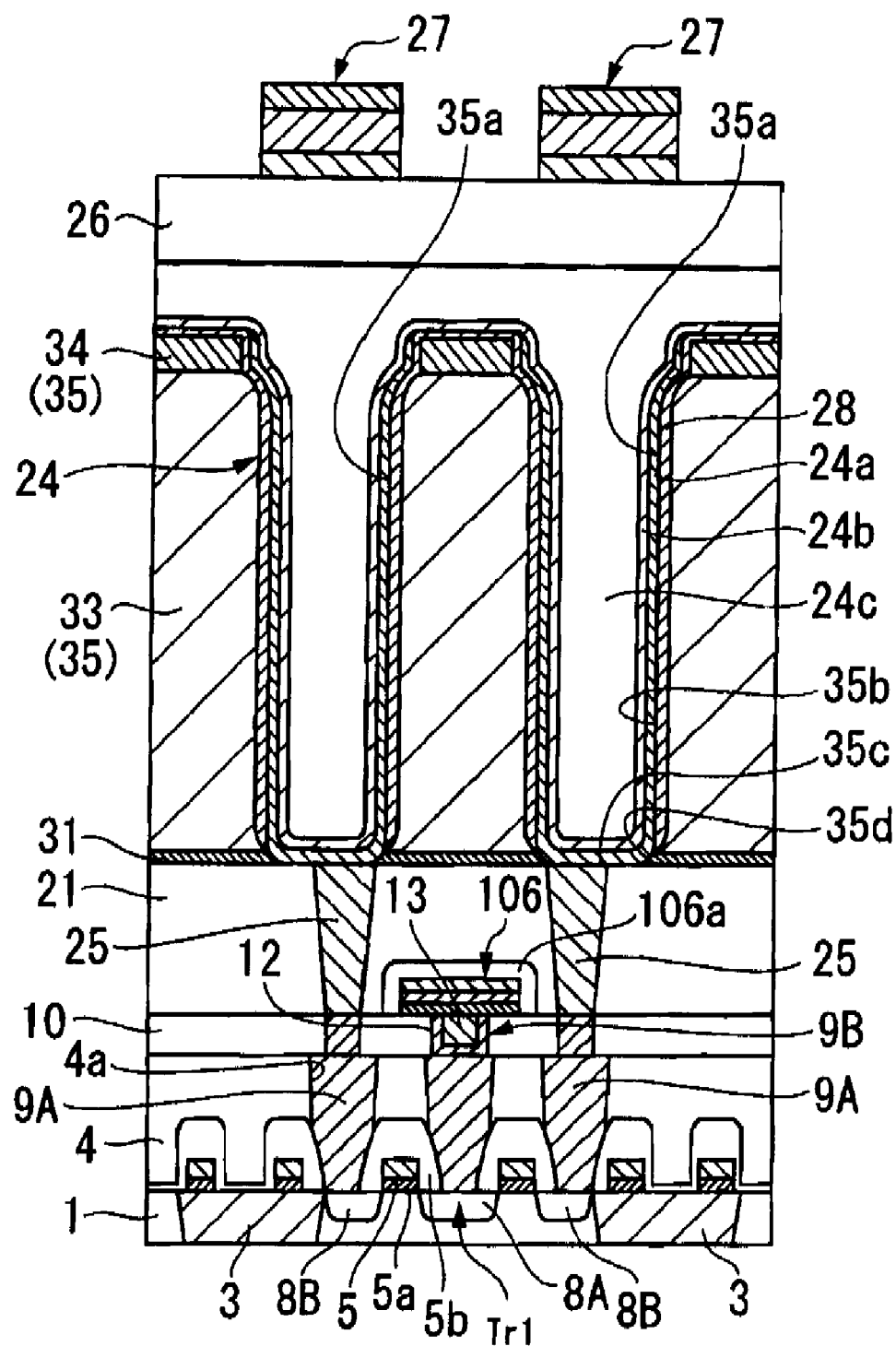
FIG. 1A is a schematic sectional view showing main parts of a memory cell in a semiconductor device according to a first embodiment of the present invention.
Figure 1B:
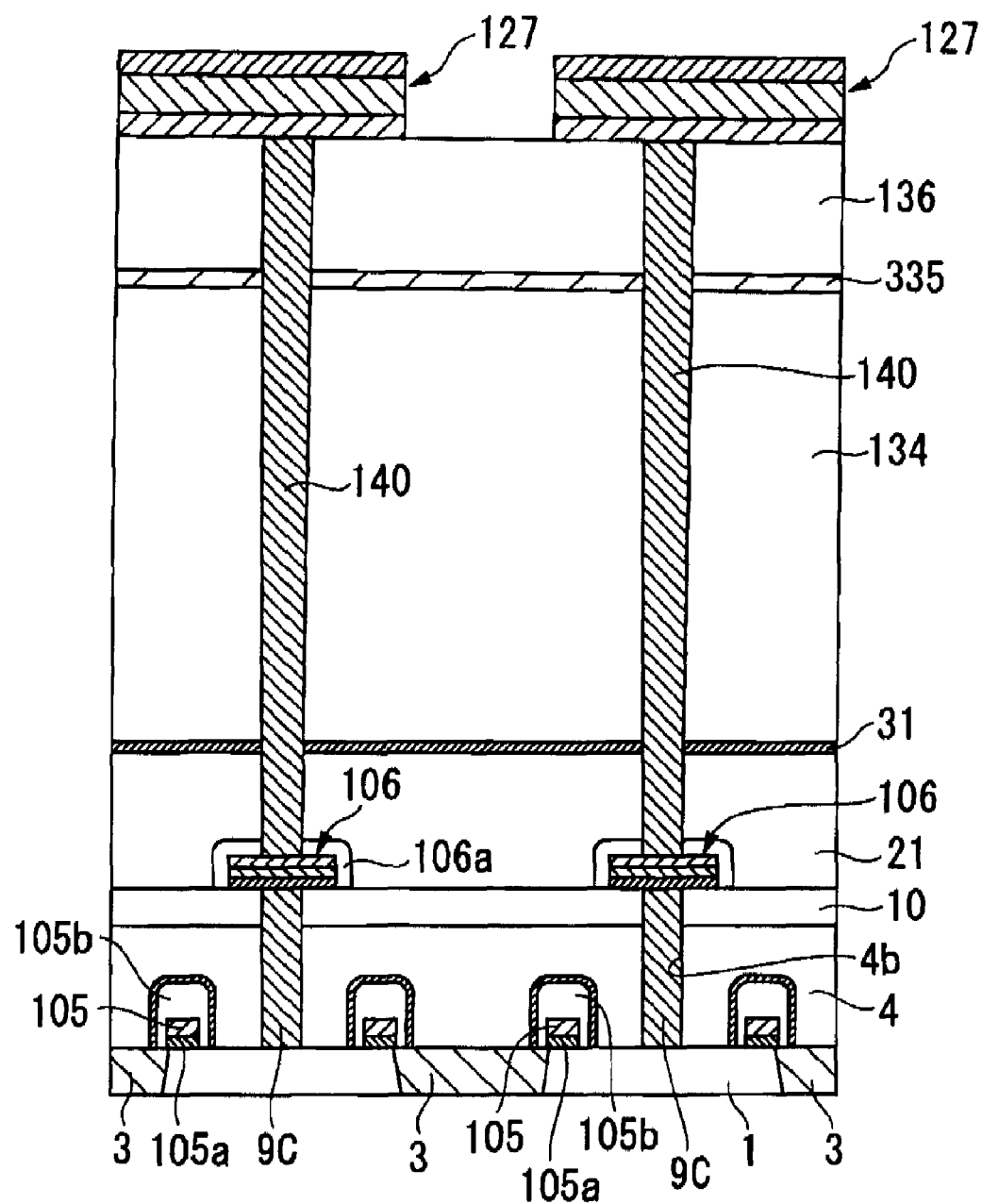
FIG. 1B is a schematic sectional view showing main parts of a peripheral circuit in a semiconductor device according to the first embodiment of the present invention.

Hereinafter, a first embodiment of the present invention will be described with reference to relevant figures. In this embodiment, a case where a DRAM device is used as a semiconductor device will be illustrated. FIGS. 1A and 1B are schematic sectional views of a DRAM device as a semiconductor device according to this embodiment, FIG. 1A showing a sectional structure of a memory cell, and FIG. 1B showing a sectional structure of a peripheral circuit. Figures referenced in the following description are used to explain a semiconductor device and a method of manufacturing the same, however, it is to be noted that size, thickness, dimensions and the like shown in the figures are different from those in actual semiconductor devices.

The DRAM device as the semiconductor device of this embodiment generally includes a memory cell and a peripheral circuit. First, the memory cell will be described with reference to FIG. 1A. As shown in FIG. 1A, the memory cell includes a memory cell select MOS transistor Tr1 (memory cell selection transistor) and a storage capacity part 24 connected to the MOS transistor Tr1 via a contact plug 9A and a capacitive contact plug 25.

In FIG. 1A, a semiconductor substrate 1 is made of a semiconductor doped with impurities of a predetermined concentration, for example, silicon. A device isolation insulating film 3 is formed on the semiconductor substrate 1.

The device isolation insulating film 3 is formed on a region other than active regions on a surface of the semiconductor substrate 1, using Shallow Trench Isolation (STI) method, isolating one active region and an adjacent active region. This embodiment shows an example where the principle of the present invention is applied to a cell structure where a two-bit memory cell is disposed in one active region.

A source 8A and a drain 8B, which are impurity diffusion regions, are formed, spaced from each other, on an active region partitioned by the device isolation insulating film 3 on the semiconductor substrate 1, with a gate electrode 5 formed between the source 8A and the drain 8B. The source 8A and the drain 8B contain diffused N-type impurities such as arsenic.

The gate electrode 5 is formed of a multi-layered film including a polycrystalline silicon film and a metal film. The polycrystalline silicon film may be a doped polycrystalline silicon film doped with impurities in film formation by a CVD (Chemical Vapor Deposition) method. The metal film may be formed of a high melting-point metal such as tungsten (W) or tungsten silicide (WSi). A gate insulating film 5a is formed between the gate electrode 5 and the semiconductor substrate 1. The gate electrode 5 is covered by an insulating film 5b such as a silicon nitride film.

In addition, as shown in FIG. 1A, a first interlayer insulating film 4 made of, for example, silicon oxide, is formed on the semiconductor substrate 1, a contact hole 4a is formed in the first interlayer insulating film 4, and a contact plug 9A connected to the source 8A and the drain 8B is formed in the contact hole 4a. The contact plug 9A is formed of, for example, a phosphorus-doped silicon layer.

In addition, a second interlayer insulating film 10 made of, for example, silicon oxide, is formed on the first interlayer insulating film 4, and a bit line contact plug 9B connected to the contact plug 9A is formed on the second interlayer insulating film 10. The bit line contact plug 9B is formed of a laminate of a Ti/TiN film 12 and a tungsten metal film 13. The Ti/TiN film 12 forms titanium silicide by reacting with silicon contained in the bit line contact plug 9B.

A bit line 106 to be connected to the bit line contact plug 9B is formed on the second interlayer insulating film 10. The bit line 106 is formed of a laminate of a tungsten nitride film and a tungsten film, and is covered by an insulating film 106a made of silicon nitride or the like.

In addition, a third interlayer insulating film 21, which covers the bit line 106 and is made of, for example, silicon oxide, is formed on the second interlayer insulating film 10. A capacitive contact plug 25 made of polysilicon or the like is formed to be connected to the contact plug 9A through the second interlayer insulating film 10 and the third interlayer insulating film 21. A first silicon nitride interlayer film 31 (silicon nitride interlayer film), a polysilicon interlayer film 33 and a silicon oxide film 34 are laminated in order on the third interlayer insulating film 21. A laminated interlayer film 35 for a storage capacity part is formed by the polysilicon interlayer film 33 and the silicon oxide film 34. A storage capacity part 24 connected to the capacitive contact plug 25 is formed on the laminated interlayer film 35.

The thickness of the first silicon nitride interlayer film 31 is, for example, 50 nm or so, the thickness of the polysilicon interlayer film 33 is, for example, 1.5 μm to 3 μm, and the thickness of the silicon oxide film 34 is, for example, 0.05 μm to 0.5 μm.

The storage capacity part 24 includes a bottom electrode film 24a, a dielectric film 24b and a top electrode film 24c laminated in order in a through-hole 35a formed in the laminated interlayer film 35.

The through-hole 35a has a substantially cylindrical shape and is partitioned by a cylindrical side wall 35b and a bottom 35c. The side wall 35b is covered by a silicon nitride insulating film 28. The third interlayer insulating film 21 and the capacitive contact plug 25 are exposed in the bottom 35c. A boundary 35d between the side wall 35b and the bottom 35c is shaped into a smooth curve.

That is, the boundary 35d between the side wall 35b and the bottom 35c in the through-hole 35a has a shape that smoothly tapers to be narrower towards the bottom thereof.

In other words, the side wall 35b smoothly rises toward an axis line of the through-hole 35a near the bottom 35c as the side wall 35b approaches the bottom 35c.

The bottom electrode film 24a is formed to cover the side wall 35b, the bottom 35c and the curved boundary 35d of the through-hole 35a. The bottom electrode film 24a contacts the capacitive contact plug 25 in the bottom 35c of the through-hole 35a, and also is connected to the MOS transistor Tr1 via the capacitive contact plug 25. N type impurities such as arsenic or phosphorus are injected in the through-hole 35a of the capacitive contact plug 25 by an ion implantation method, and accordingly, resistivity between the capacitive contact plug 25 and the bottom electrode film 24a is lowered.

The dielectric film 24b is formed to cover the bottom electrode film 24a and continues between adjacent through-holes 35a. Like the dielectric film 24b, the top electrode film 24c continues between adjacent through-holes 35a and serves as a plate electrode. A conductive film 26 made of tungsten or the like is laminated on the top electrode film 24c and a wiring layer 27 is formed on the conductive film 26. The wiring layer 27 is formed of a laminate of a tungsten nitride film and a tungsten film.

Next, the peripheral circuit will be described with reference to FIG. 1B. The peripheral circuit includes the device isolation insulating film 3 embedded in the semiconductor substrate 1, a gate electrode 105 formed on the semiconductor substrate 1, a gate insulating film 105a formed between the gate electrode 105 and the semiconductor substrate 1, and an insulating film 105b which covers the gate electrode 105 and is made of silicon nitride or the like.

In addition, as shown in FIG. 1B, the first interlayer insulating film 4 and the second interlayer insulating film 10 are formed on the semiconductor substrate 1, a contact hole 4b is formed in the first interlayer insulating film 4 and the second interlayer insulating film 10, and a contact plug 9C is formed in the contact hole 4b. The contact plug 9C is formed of, for example, a phosphorus-doped silicon layer.

In addition, the bit line 106 to be connected to the contact plug 9C is formed on the second interlayer insulating film 10. The bit line 106 is covered by the insulating film 106a made of silicon nitride or the like.

In addition, as shown in FIG. 1B, the third interlayer insulating film 21 covering the bit line 106 is laminated on the second interlayer insulating film 10. The first silicon nitride interlayer film 31 is formed on the third interlayer insulating film 21. A fourth interlayer insulating film 134 made of silicon oxide is formed on the first silicon nitride interlayer film 31. A second silicon nitride interlayer film 335 is formed on the fourth interlayer insulating film 134. A fifth interlayer insulating film 136 made of silicon oxide is formed on the second silicon nitride interlayer film 335. A wiring layer 127 is formed on the fifth interlayer insulating film 136. The wiring layer 127 is connected to the bit line 106 via the contact plug 140.

(Method of Manufacturing Semiconductor Device of First Embodiment)

Next, an example of a method of manufacturing the above-described semiconductor device will be described with reference to FIGS. 2A to 10B.

A method of manufacturing the semiconductor device of this embodiment generally includes a process of forming the laminated interlayer film 35 in a formation region of the memory cell after forming the MOS transistor Tr1 and so on, a process of forming the through-hole 35a on the laminated interlayer film 35, and a process of forming the storage capacity part 24 in the through-hole 35a.

(Process of Forming Laminated Interlayer Film 35)

Figure 2A:
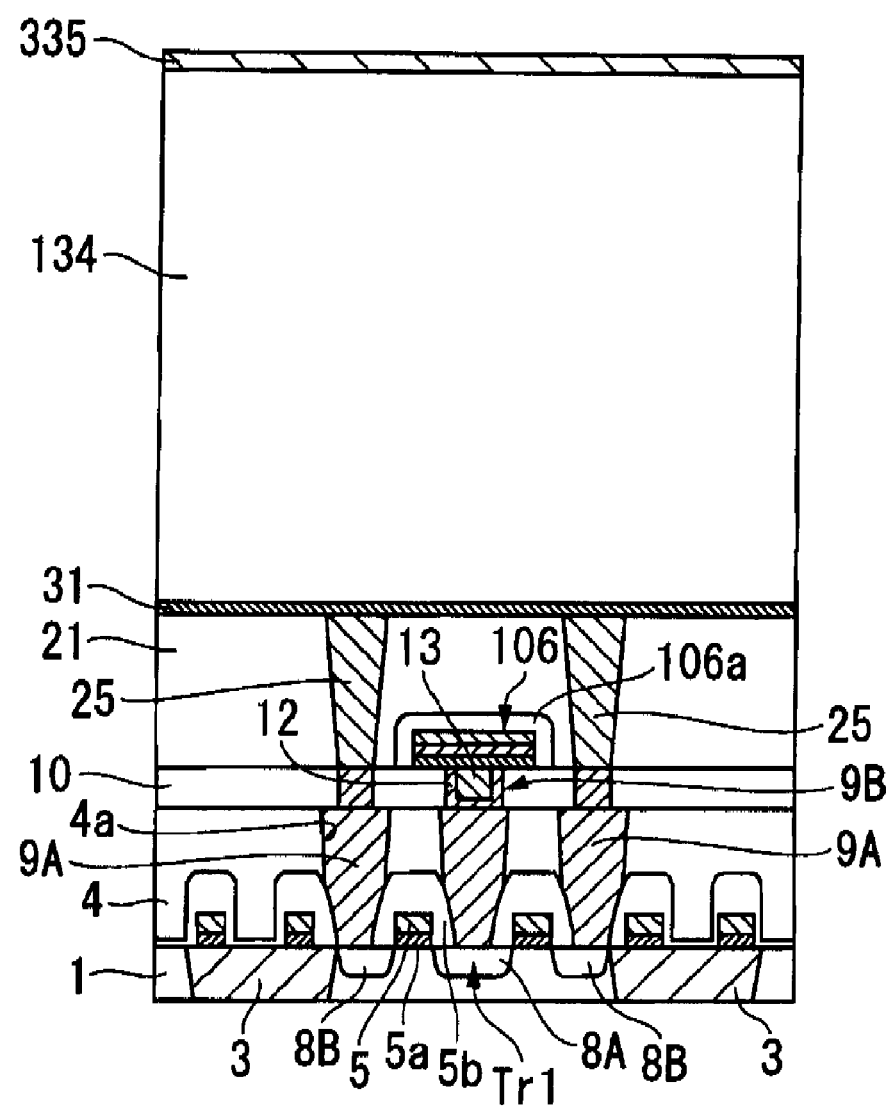
FIG. 2A is a schematic sectional view showing main parts of a memory cell for explaining a process of forming an interlayer film in a method of manufacturing the semiconductor device according to the first embodiment of the present invention.

Prior to this process, the MOS transistor Tr1 and so on are formed on the semiconductor substrate 1. That is, as shown in FIG. 2A, the MOS transistor Tr1 including the gate electrode 5, the gate insulating film 5a, the source 8A and the drain 8B are formed on the semiconductor substrate at a side of the memory cell, and then, the first, second and third interlayer insulating films 4, 10 and 21 are laminated in order on the semiconductor substrate 1. In addition, the contact plug 9A, the capacitive contact plug 25 and the bit line contact plug 9B are respectively formed on the first, second and third interlayer insulating films 4, 10 and 21. In addition, the bit line 106 to be connected to the bit line contact plug 9B is formed on the second interlayer insulating film 10.

In addition, the gate electrode 105 and the gate insulating film 105a are formed on the semiconductor substrate 1 at a side of the peripheral circuit. In addition, the first, second and third interlayer insulating films 4, 10 and 21 are laminated on the semiconductor substrate 1, and the contact plug 9C is formed on the first, second and third interlayer insulating films 4, 10 and 21. In addition, the bit line 106 to be connected to the bit line contact plug 9C is formed on the second interlayer insulating film 10.

Figure 2B:
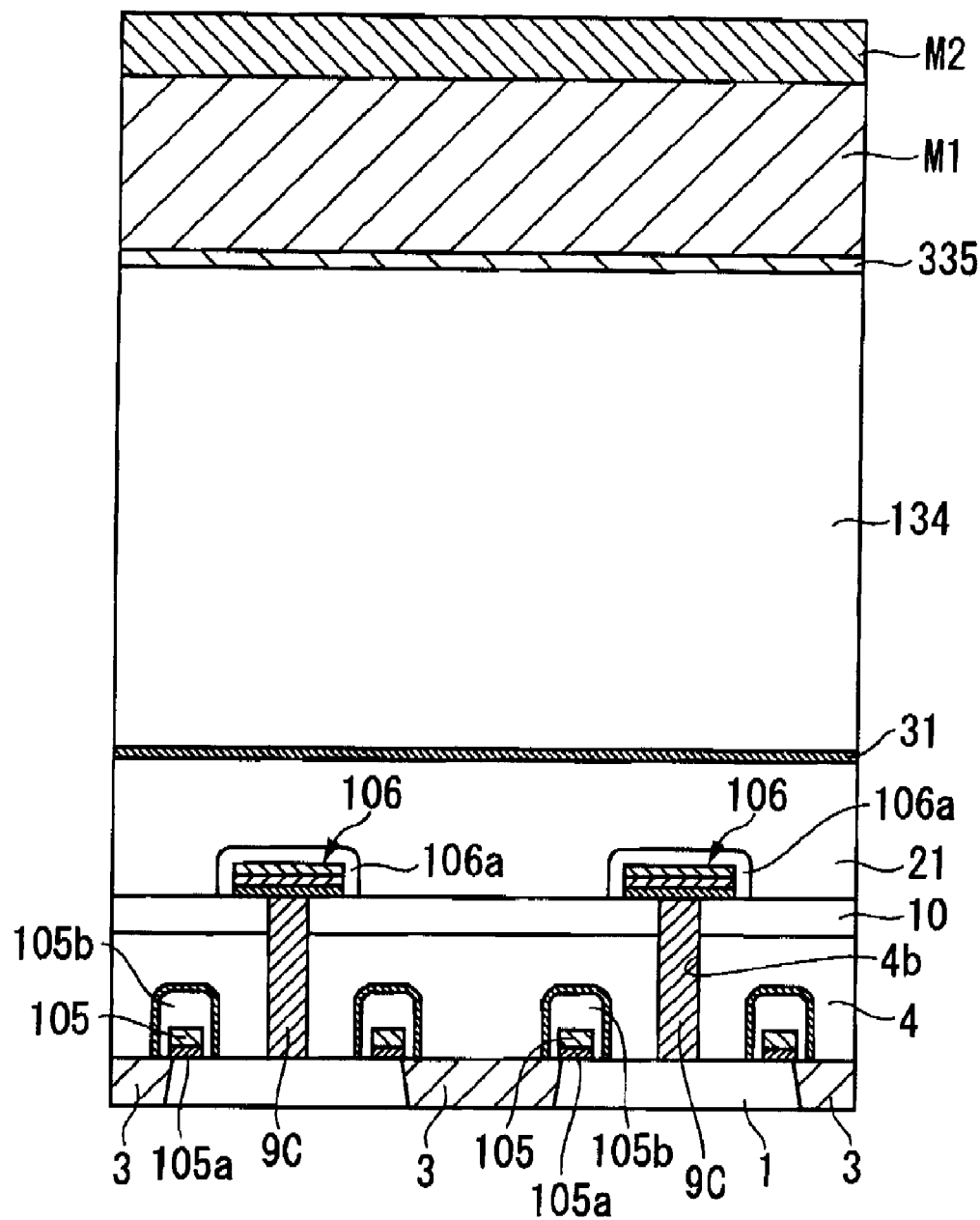
FIG. 2B is a schematic sectional view showing main parts of a peripheral circuit for explaining a process of forming an interlayer film in a method of manufacturing the semiconductor device according to the first embodiment of the present invention.

In this process, as shown in FIGS. 2A and 2B, the first silicon nitride interlayer film 31 of a thickness of 50 nm, the fourth silicon oxide interlayer film 134 of a thickness of 2 μm, and the second silicon nitride interlayer film 335 of a thickness of 50 nm are formed in order on the third interlayer insulating film 21. Next, a hard mask layer M1 and a photoresist layer M2 are formed on the second silicon nitride interlayer film 335 to the side of the peripheral circuit.

The material of the hard mask layer M1 is preferably amorphous carbon, for example. In addition, the thickness of the hard mask layer M1 is preferably in a range of, for example, 0.3 μm to 1.5 μm. The thickness of the photoresist layer M2 is preferably in a range of 100 nm to 500 nm, more preferably 300 nm, for example.

In addition, a laminated film of $SiO_2$/SiON as an antireflection film may be formed between the hard mask layer M1 and the photoresist layer M2.

Figure 3A:
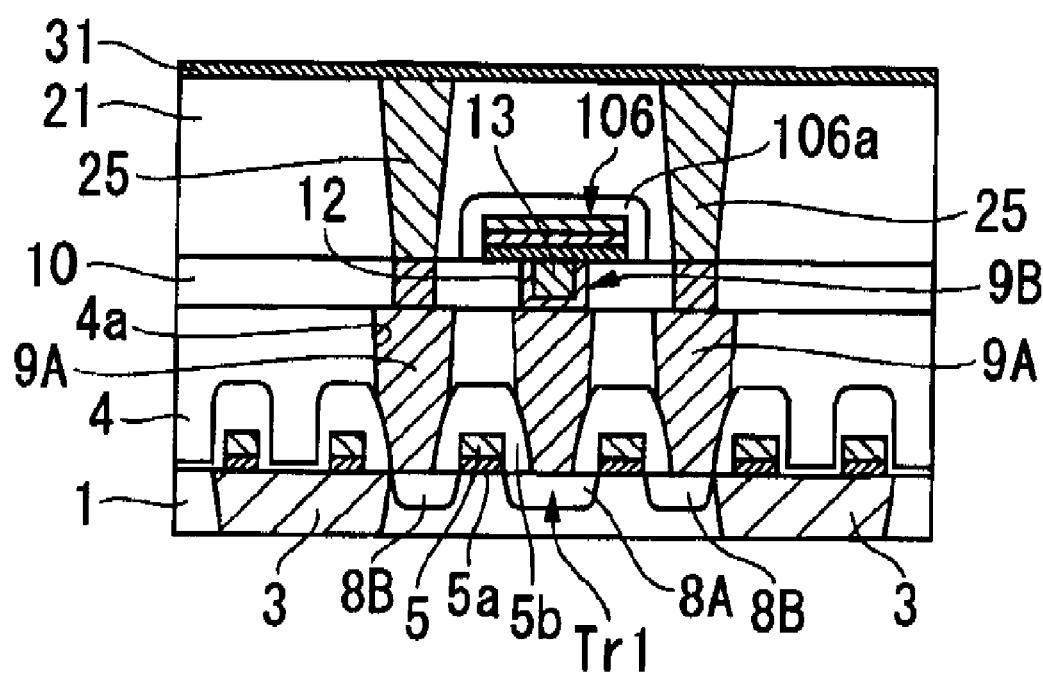
FIG. 3A is a schematic sectional view showing main parts of a memory cell for explaining a process of forming an interlayer film in a method of manufacturing the semiconductor device according to the first embodiment of the present invention.
Figure 3B:
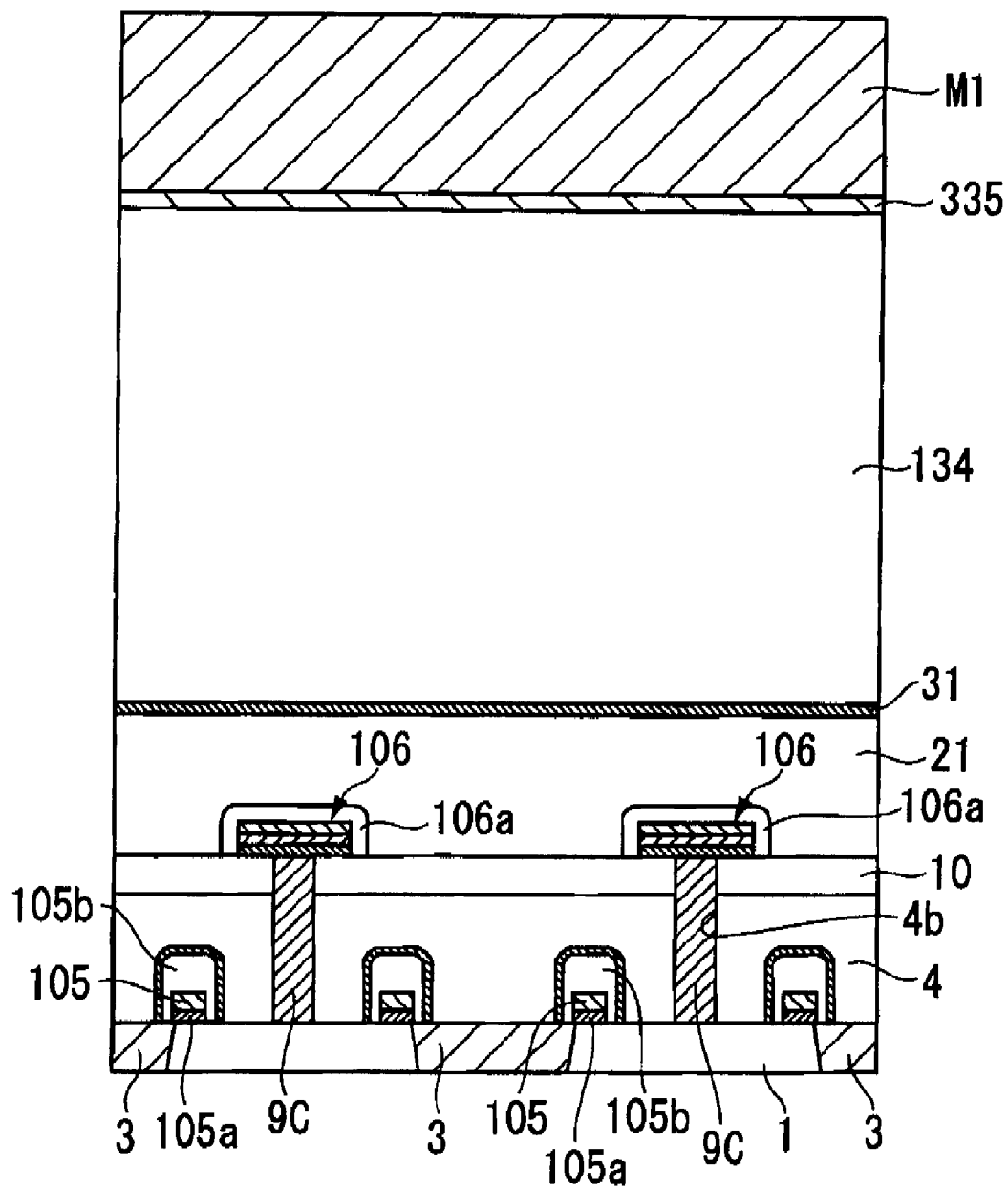
FIG. 3B is a schematic sectional view showing main parts of a peripheral circuit for explaining a process of forming an interlayer film in a method of manufacturing the semiconductor device according to the first embodiment of the present invention.

Next, as shown in FIGS. 3A and 3B, the fourth interlayer insulating film 134 and the second silicon nitride interlayer film 335 are removed by a dry etching using the hard mask layer M1 and the photoresist layer M2 as a mask. The first silicon nitride interlayer film 31 at a side of the memory cell functions as a stopper in the dry etching. Almost all the photoresist layer M2 is etched at the time by the dry etching.

Figure 4A:
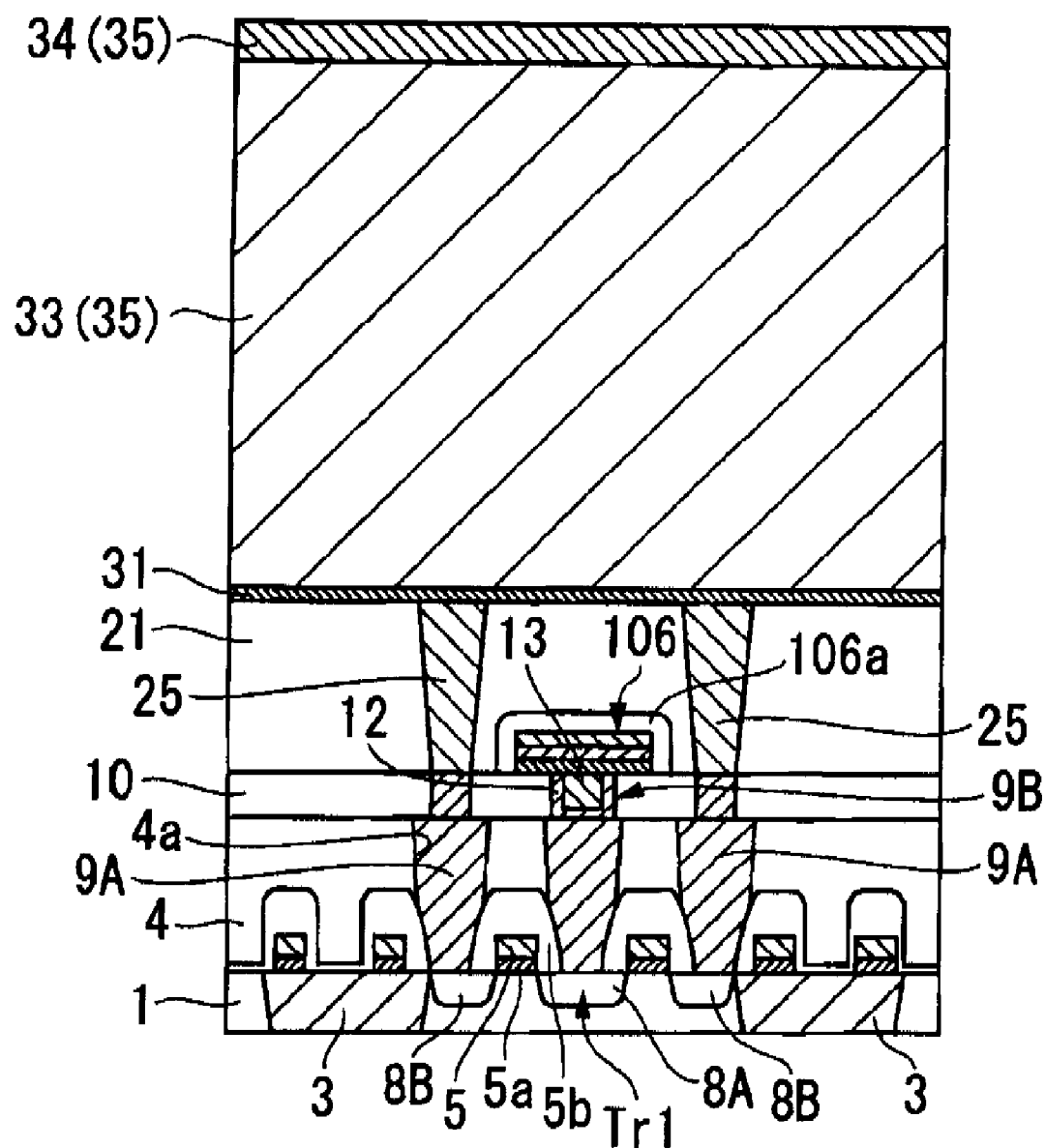
FIG. 4A is a schematic sectional view showing main parts of a memory cell for explaining a process of forming an interlayer film in a method of manufacturing the semiconductor device according to the first embodiment of the present invention.
Figure 4B:
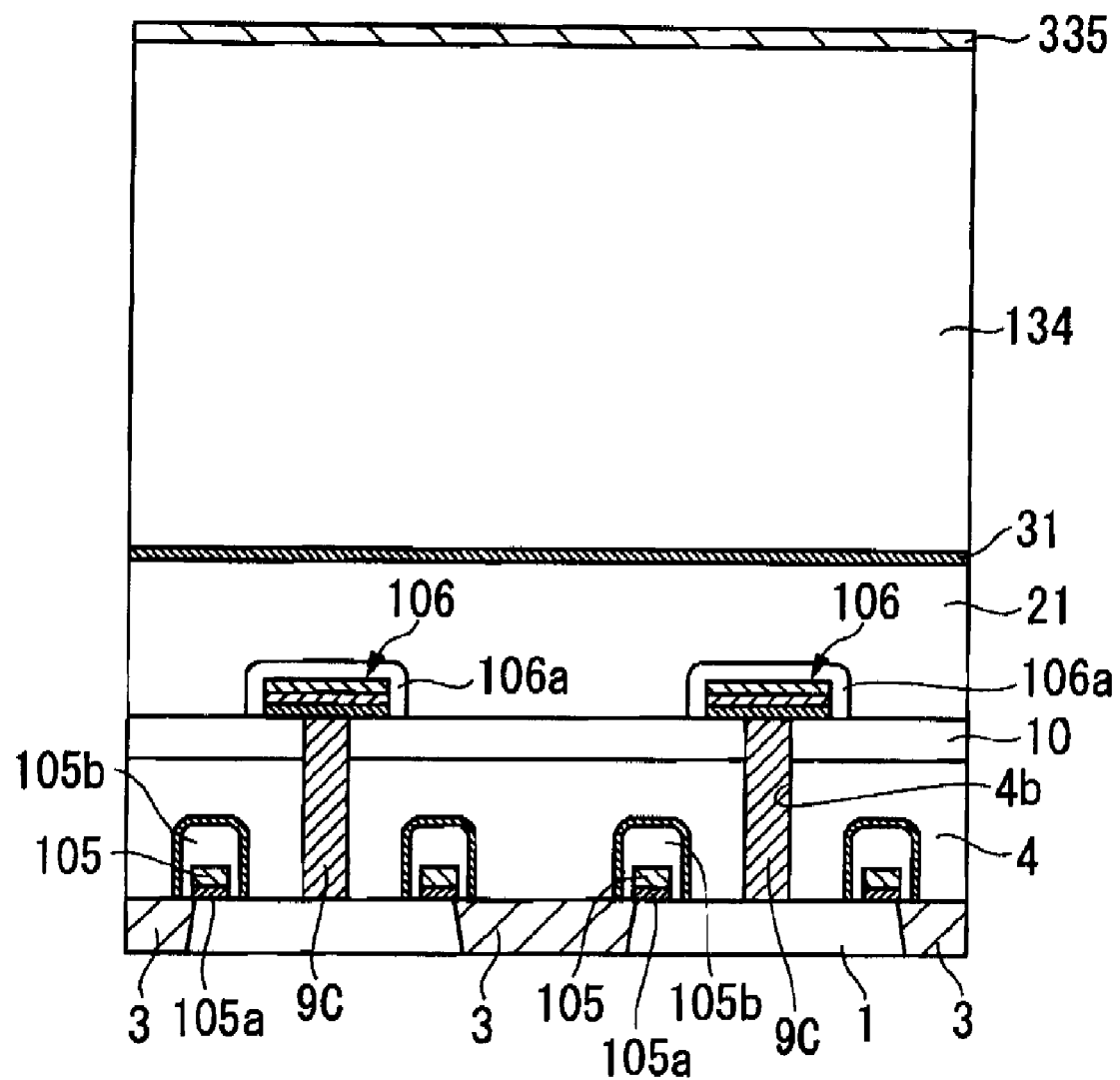
FIG. 4B is a schematic sectional view showing main parts of a peripheral circuit for explaining a process of forming an interlayer film in a method of manufacturing the semiconductor device according to the first embodiment of the present invention.

Next, as shown in FIGS. 4A and 4B, the polysilicon interlayer film 33 of a thickness of 1.5 μm to 3 μm and the silicon oxide film 34 of a thickness of 0.1 μm to 0.5 μm for antioxidation are laminated in order on the first silicon nitride interlayer film 31 at a side of the memory cell. The polysilicon interlayer film 33 and the silicon oxide film 34 are also laminated in order on the hard mask layer M1 at a side of the peripheral circuit. After laminating the films, the hard mask layer M1 is removed. At this time, the polysilicon interlayer film 33 and the silicon oxide film 34 on the hard mask layer M1 are lifted off and removed together with the hard mask layer M1 at the time. After forming the polysilicon interlayer film 33, the polysilicon interlayer film 33 may be annealed at 700° C. to 1150° in order to increase crystallinity of the polysilicon interlayer film 33. This allows an increase of an aspect ratio of the through-hole 35a to be formed in a later process.

Then, the top of the silicon oxide film 34 is planarized by a CMP method. At this time, the planarization may be carried out such that the top of the silicon oxide film 34 has the same level as the top of the silicon nitride interlayer film 335 at a side of the peripheral circuit.

In this manner, the laminated interlayer film 35 including the polysilicon interlayer film 33 and the silicon oxide film 34 is formed.

(Process of Forming Through-Hole 35a)

Figure 5A:
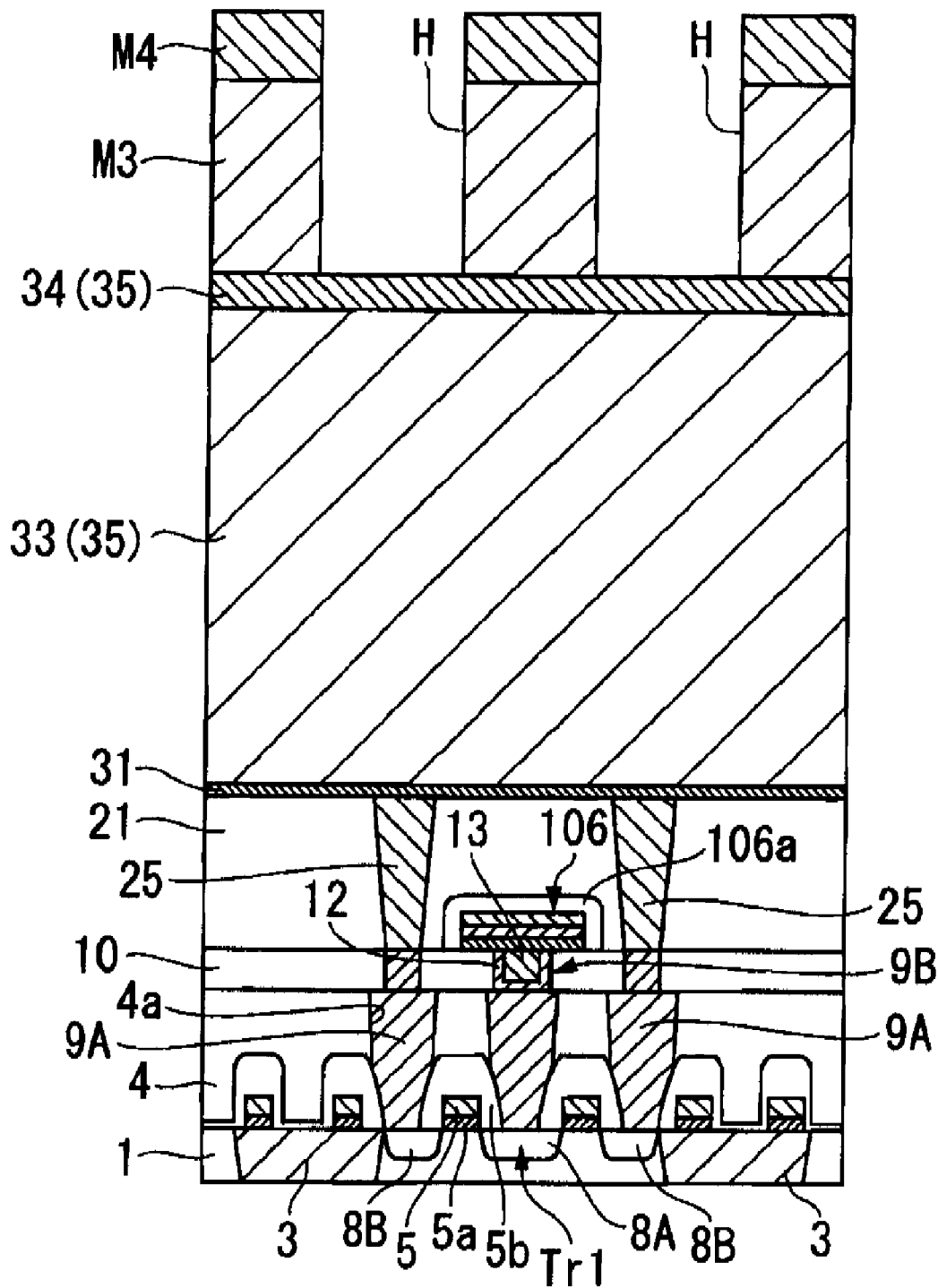
FIG. 5A is a schematic sectional view showing main parts of a memory cell for explaining a process of forming a through-hole in a method of manufacturing the semiconductor device according to the first embodiment of the present invention.
Figure 5B:
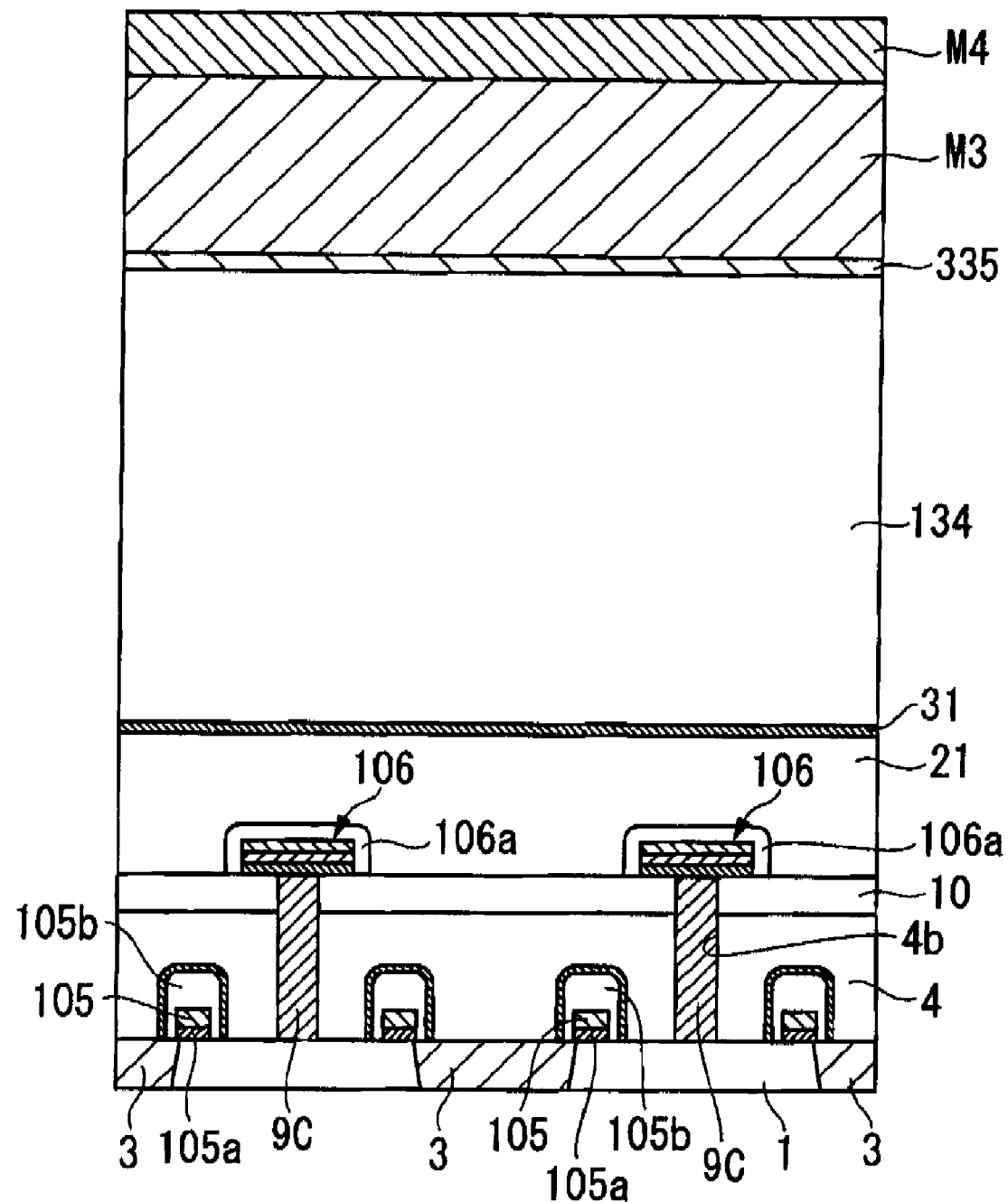
FIG. 5B is a schematic sectional view showing main parts of a peripheral circuit for explaining a process of forming a through-hole in a method of manufacturing the semiconductor device according to the first embodiment of the present invention.

Next, as shown in FIGS. 5A and 5B, a hard mask layer M3 and a photoresist layer M4 for through-hole formation are formed on the entire surfaces of the silicon oxide film 34 and the second silicon nitride interlayer film 335. Then, an opening H for through-hole formation is provided in the hard mask layer M3 and the photoresist layer M4 at a side of the memory cell.

The material of the hard mask layer M3 is preferably a material having an etching rate lower than that of polysilicon, for example, amorphous carbon, silicon oxide, silicon nitride, etc. In addition, the thickness of the hard mask layer M3 is preferably 300 nm to 1000 nm, for example. The thickness of the photoresist layer M4 is preferably 100 nm to 500 nm, for example.

Figure 6A:
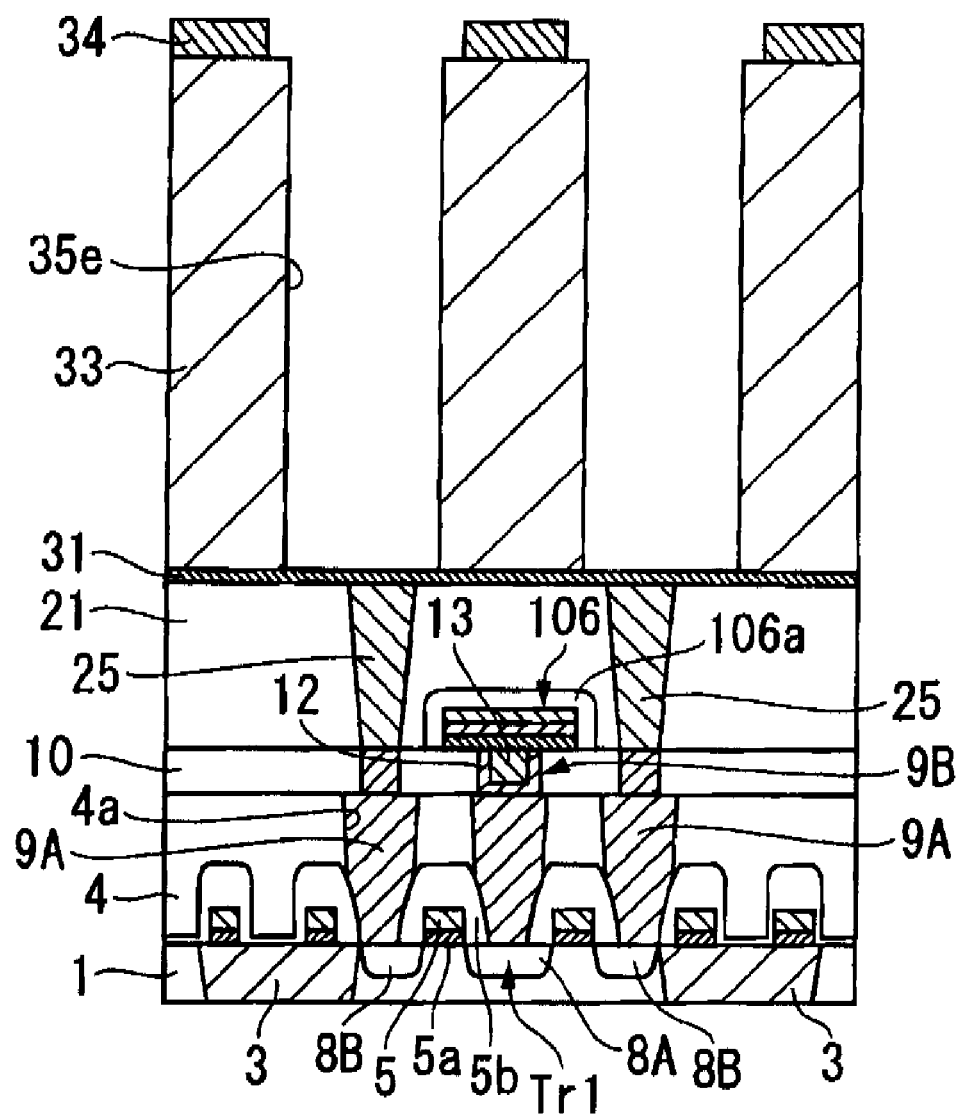
FIG. 6A is a schematic sectional view showing main parts of a memory cell for explaining a process of forming a through-hole in a method of manufacturing the semiconductor device according to the first embodiment of the present invention.
Figure 6B:
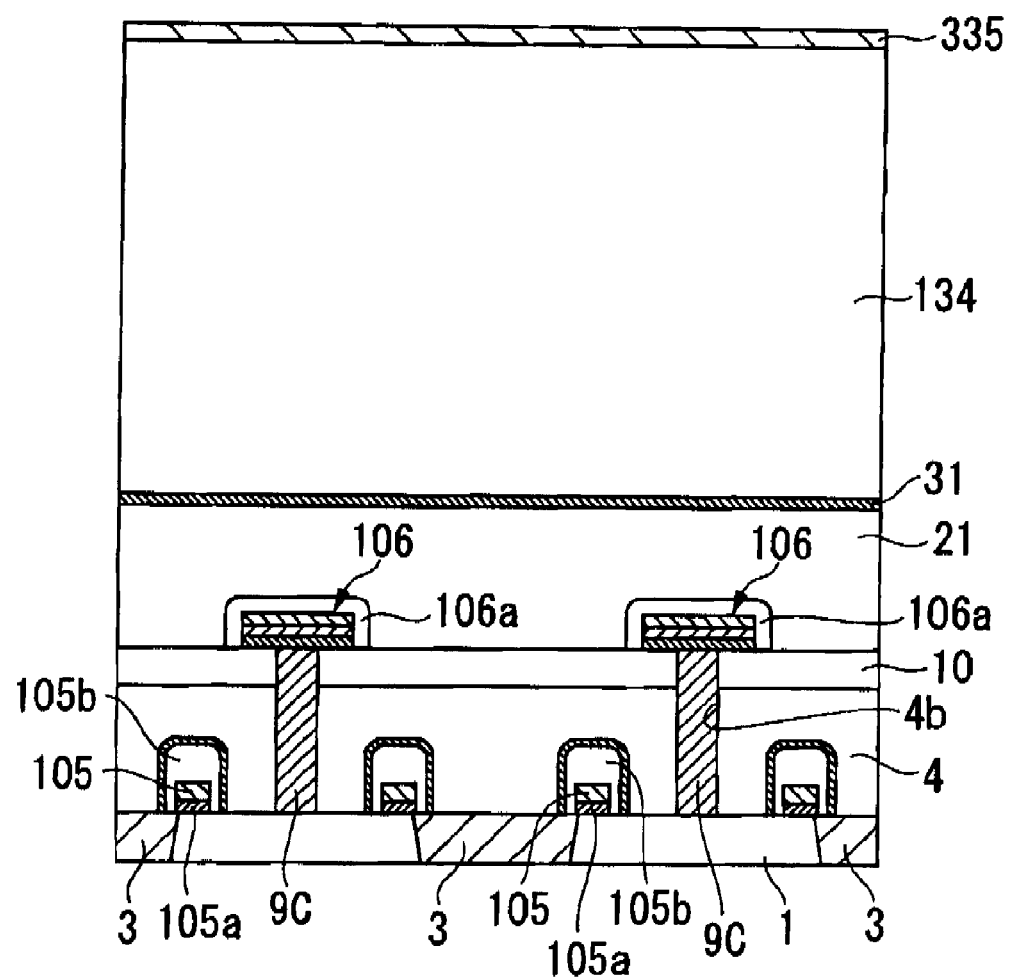
FIG. 6B is a schematic sectional view showing main parts of a peripheral circuit for explaining a process of forming a through-hole in a method of manufacturing the semiconductor device according to the first embodiment of the present invention.

Next, as shown in FIGS. 6A and 6B, a preliminary through-hole 35e is formed by performing an anisotropic etching using the first silicon nitride interlayer film 31 as an etching stopper at a position corresponding to the opening H of the silicon oxide film 34 and the polysilicon interlayer film 33. Thus, the first silicon nitride interlayer film 31 is exposed in the bottom of the preliminary through-hole 35e. Thereafter, the hard mask layer M3 and the photoresist layer M4 are removed.

Since the hard mask layer M3 for through-hole formation has an etching rate lower than that of the polysilicon interlayer film 33, the hard mask layer M3 remains thin even after the preliminary through-hole 35e is provided in the polysilicon interlayer film 33. In this manner, since the hard mask layer M3 is always presented while forming the preliminary through-hole 35e, it is possible to form the through-hole 35a deeply.

In addition, by anisotropically etching the polysilicon interlayer film 33, an aspect ratio of the preliminary through-hole 35e is increased as compared to when silicon oxide is conventionally etched, and accordingly, an aspect ratio of the through-hole 35a to be formed finally is increased. An aspect ratio of the through-hole 35a refers to a division of depth of the through-hole 35a by the diameter of the through-hole 35a.

Figure 7A:
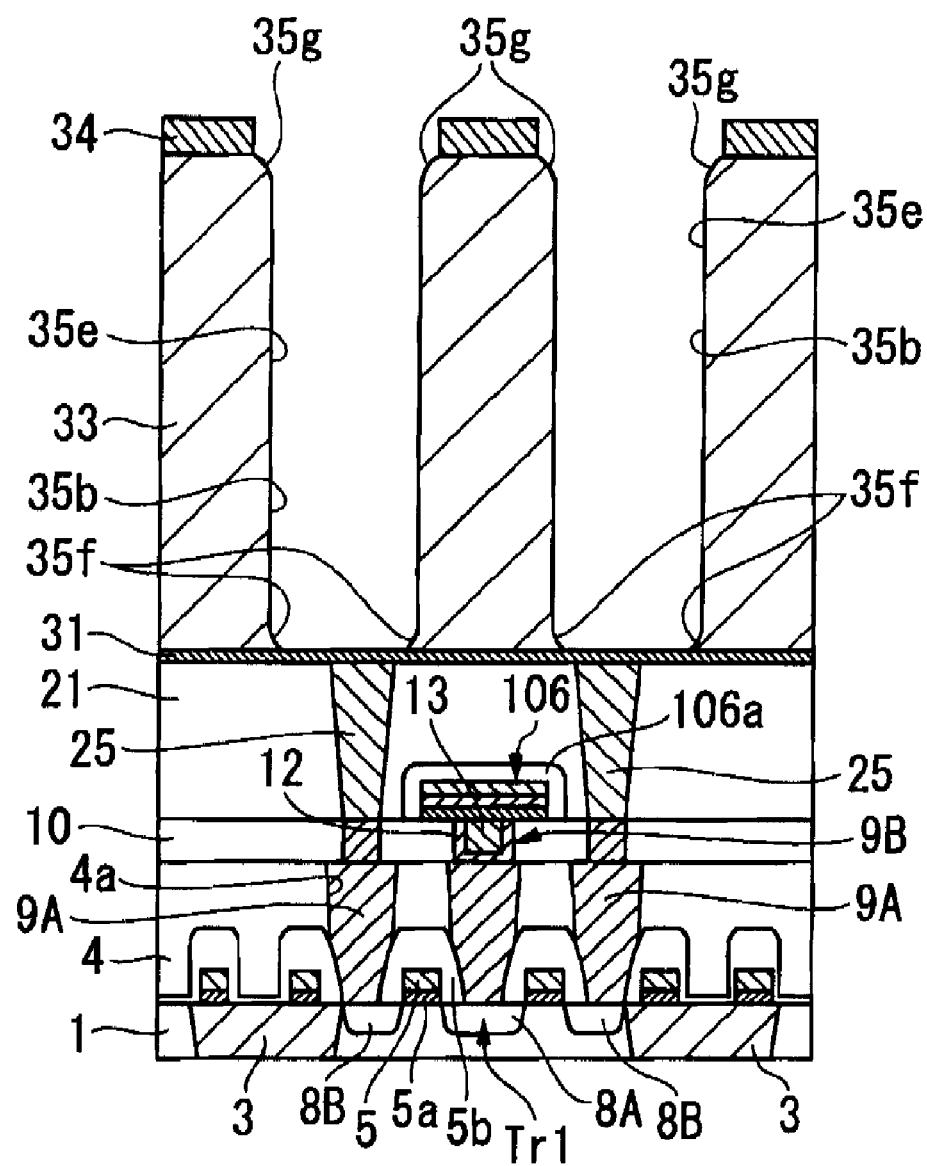
FIG. 7A is a schematic sectional view showing main parts of a memory cell for explaining a process of forming a through-hole in a method of manufacturing the semiconductor device according to the first embodiment of the present invention.
Figure 7B:
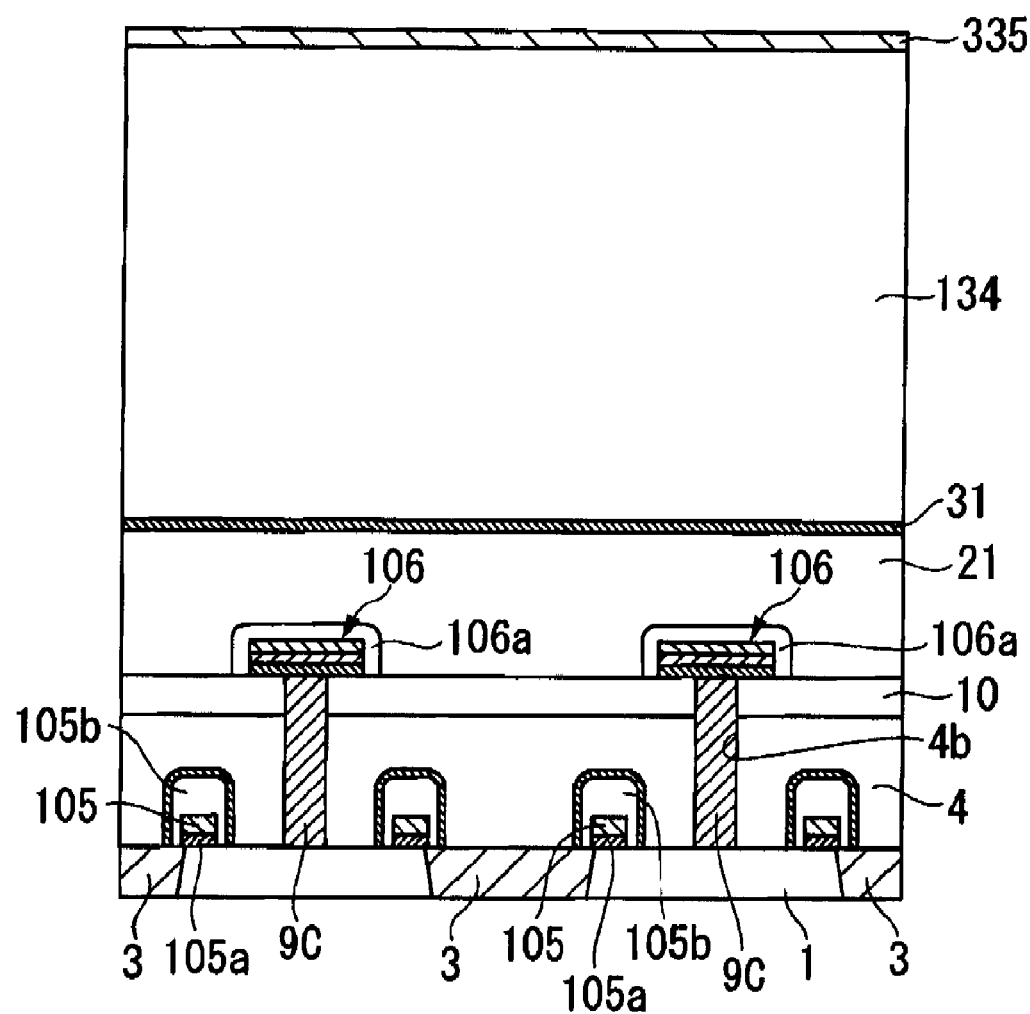
FIG. 7B is a schematic sectional view showing main parts of a peripheral circuit for explaining a process of forming a through-hole in a method of manufacturing the semiconductor device according to the first embodiment of the present invention.

Next, as shown in FIGS. 7A and 7B, the polysilicon interlayer film 33 is annealed in a hydrogen atmosphere or an inert gas atmosphere. This annealing causes migration of silicon atoms contained in the polysilicon interlayer film 33. As a result, an interface 35f between the side wall 35b of the preliminary through-hole 35e and the first silicon nitride interlayer film 31 is shaped into a curve. At the same time, an interface 35g between the side wall 35b of the preliminary through-hole 35e and the top of the polysilicon interlayer film 33 is shaped into a curve. Such curving of the interfaces 35f and 35g occurs, evidently, to minimize a surface area of the preliminary through-hole 35e by the migration of silicon atoms.

That is, the side wall 35b of the preliminary hole 35e has a curved surface whose end is expanded at the interface 35g.

In other words, the side wall 35b is smoothly expanded away from an axis line of the through-hole 33a near the top 33a as the side wall 35b approaches the top 35a.

The annealing in the hydrogen atmosphere or the inert gas atmosphere is preferably an RTA treatment at 800° C. to 1100° C., for example. The annealing atmosphere may be either the hydrogen atmosphere or the inert gas atmosphere, but particularly may be preferably a reducing atmosphere including hydrogen. Annealing in the reducing atmosphere including hydrogen can easily cause migration of silicon atoms even when a thin oxide film exists on a surface of polysilicon.

Figure 8A:
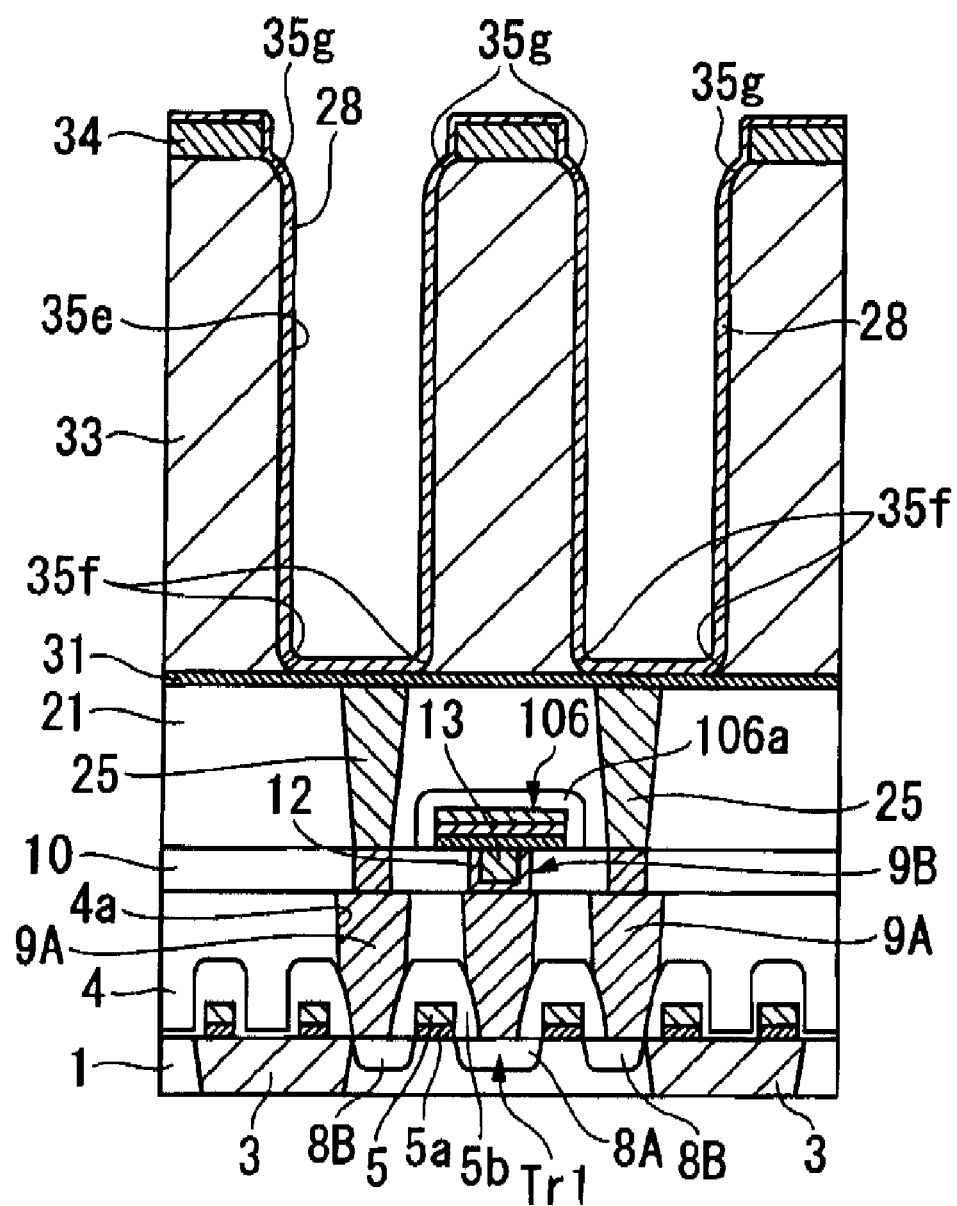
FIG. 8A is a schematic sectional view showing main parts of a memory cell for explaining a process of forming a through-hole in a method of manufacturing the semiconductor device according to the first embodiment of the present invention.
Figure 8B:
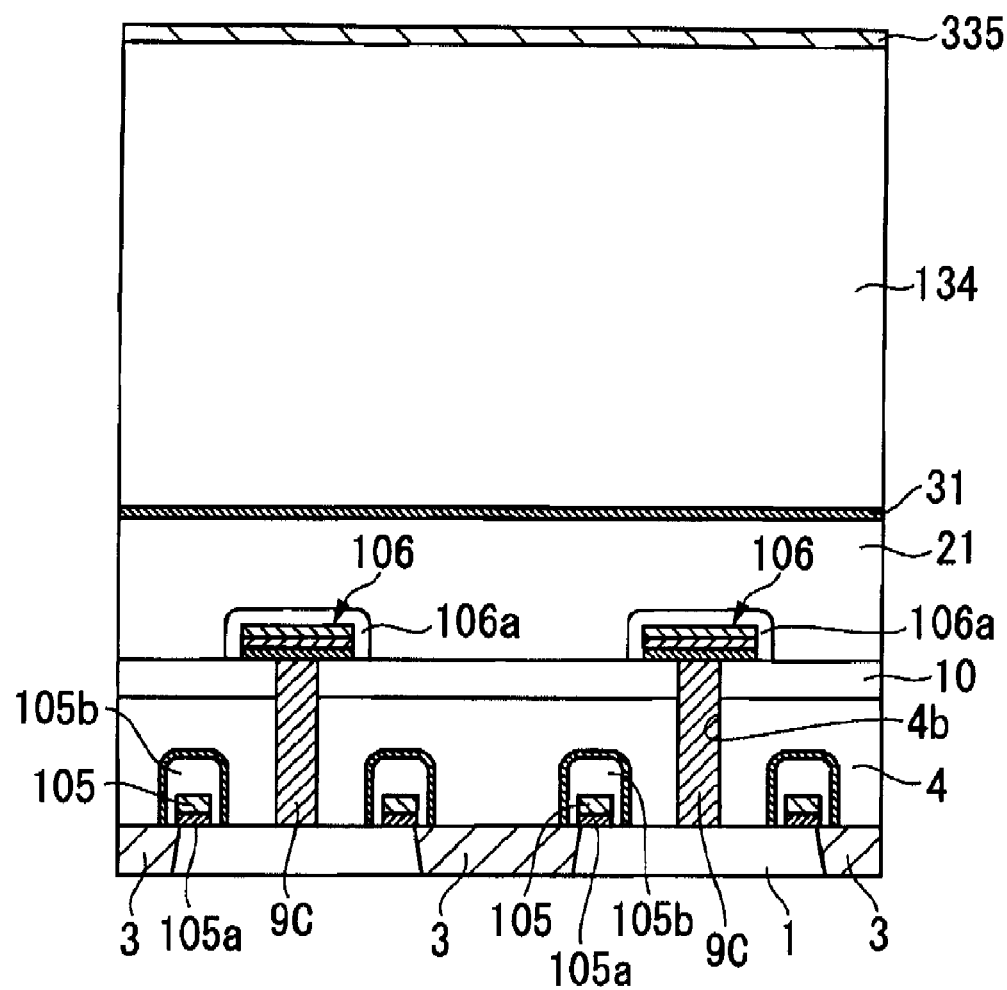
FIG. 8B is a schematic sectional view showing main parts of a peripheral circuit for explaining a process of forming a through-hole in a method of manufacturing the semiconductor device according to the first embodiment of the present invention.

Next, as shown in FIGS. 8A and 8B, a silicon nitride insulating film 28 is formed in the preliminary through-hole 35e and on the silicon oxide film 34 by a CVD method or an ALD method. Using the CVD method or the ALD method with excellent step coverage, the silicon nitride insulating film 28 having uniform thickness is formed in the preliminary through-hole 35e.

Figure 9A:
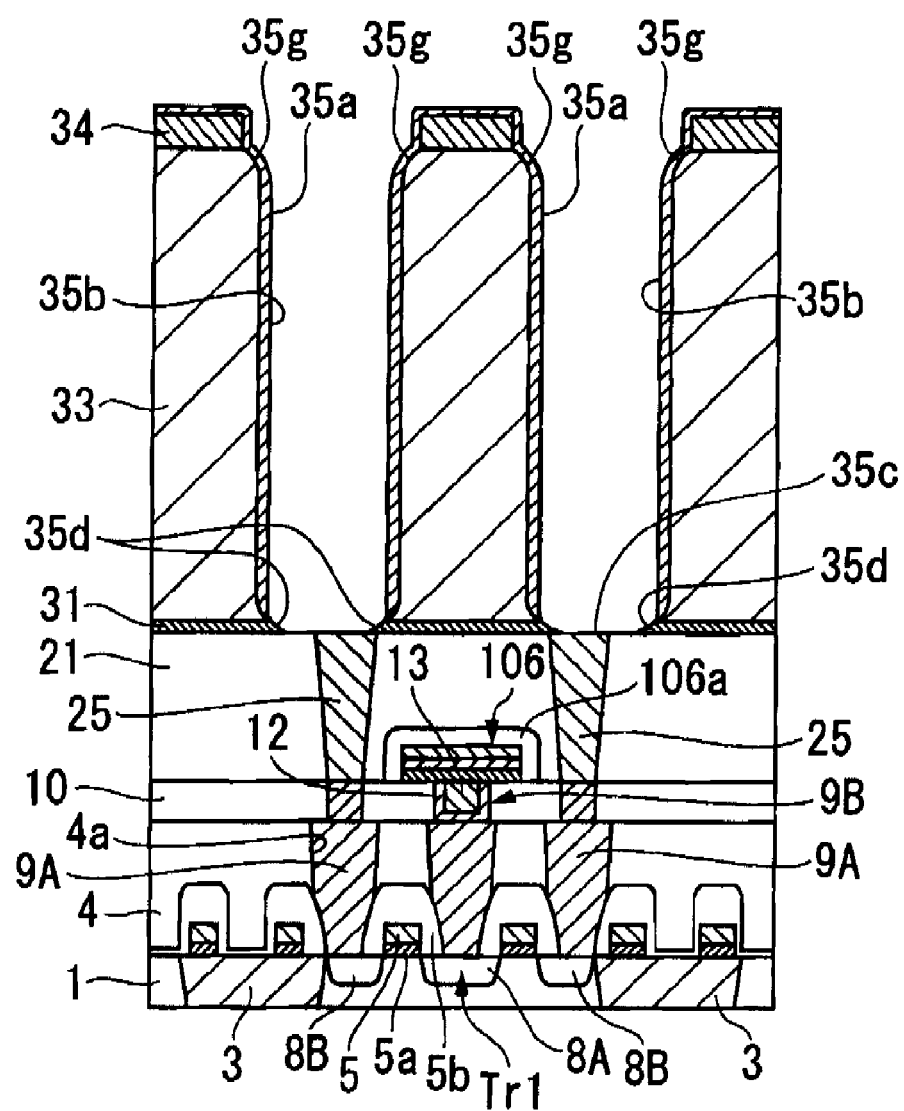
FIG. 9A is a schematic sectional view showing main parts of a memory cell for explaining a process of forming a through-hole in a method of manufacturing the semiconductor device according to the first embodiment of the present invention.
Figure 9B:
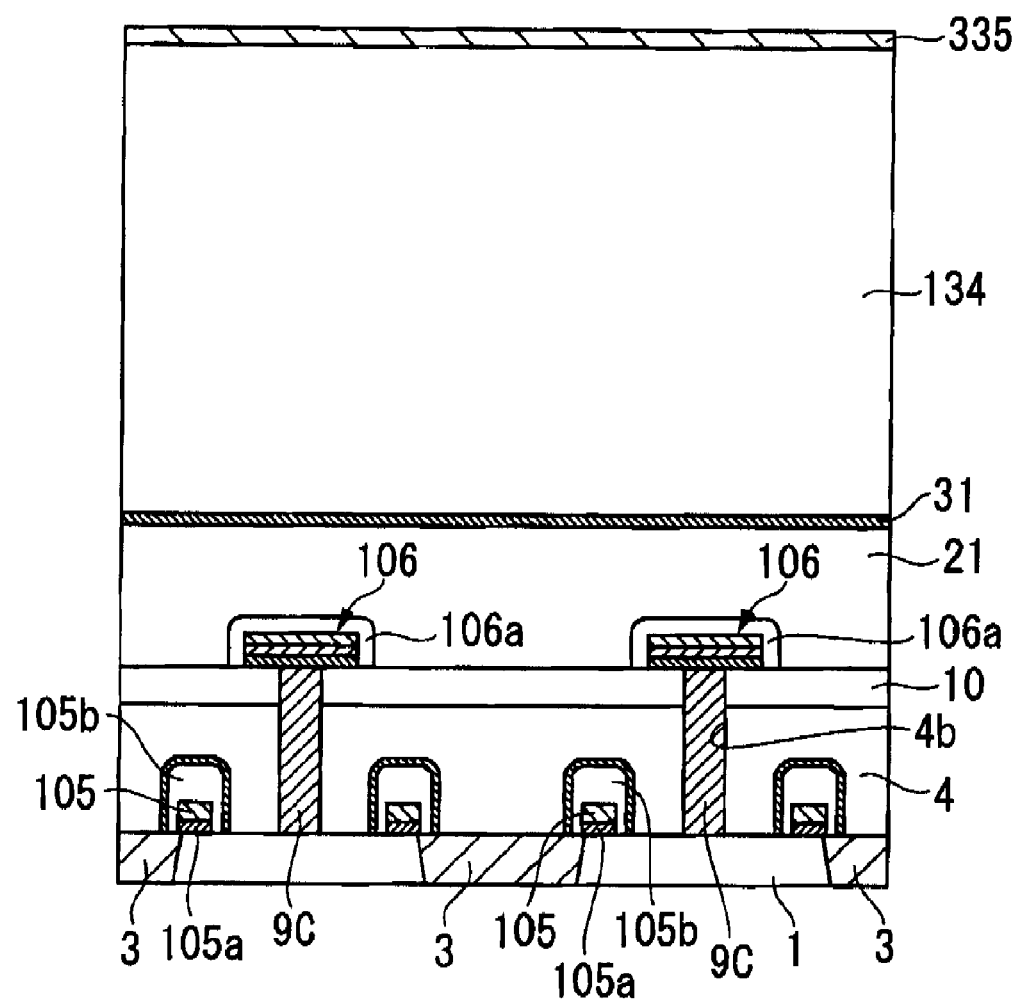
FIG. 9B is a schematic sectional view showing main parts of a peripheral circuit for explaining a process of forming a through-hole in a method of manufacturing the semiconductor device according to the first embodiment of the present invention.

Next, as shown in FIGS. 9A and 9B, the silicon nitride insulating film 28 laminated on the bottom of the preliminary through-hole 35e and the first silicon nitride interlayer film 31 lying below the film 28 are removed by an anisotropic etching. Accordingly, the top of the capacitive contact plug 25 is exposed. The silicon nitride insulating film 28 formed on the side wall of the preliminary through-hole 35e remains without being etched. In this manner, the through-hole 35a is formed.

In addition, the curved shape of the interface 35f in the preliminary through-hole 35e remains unchanged in the anisotropic etching. Accordingly, the boundary 35d between the side wall 35b and the bottom 35c of the through-hole 35a is shaped in a curve corresponding to the shape of the interface 35f.

In this manner, the through-hole 35a having the curved boundary 35d is formed.

In addition, after forming the through-hole 35a, N type impurities such as arsenic or phosphorus may be injected onto the capacitive contact plug 25 exposed in the bottom of the through-hole 35a. This allows a decrease of resistivity of the capacitive contact plug 25 and a decrease of contact resistance between the storage capacity part 24, which will be formed later and the capacitive contact plug 25. In addition, as the silicon oxide film 34 serves as a mask layer of the polysilicon interlayer film 33 when ions are injected, the ions are prevented from being injected into the polysilicon interlayer film 33.

(Process of Forming Storage Capacity Part 24)

Figure 10A:
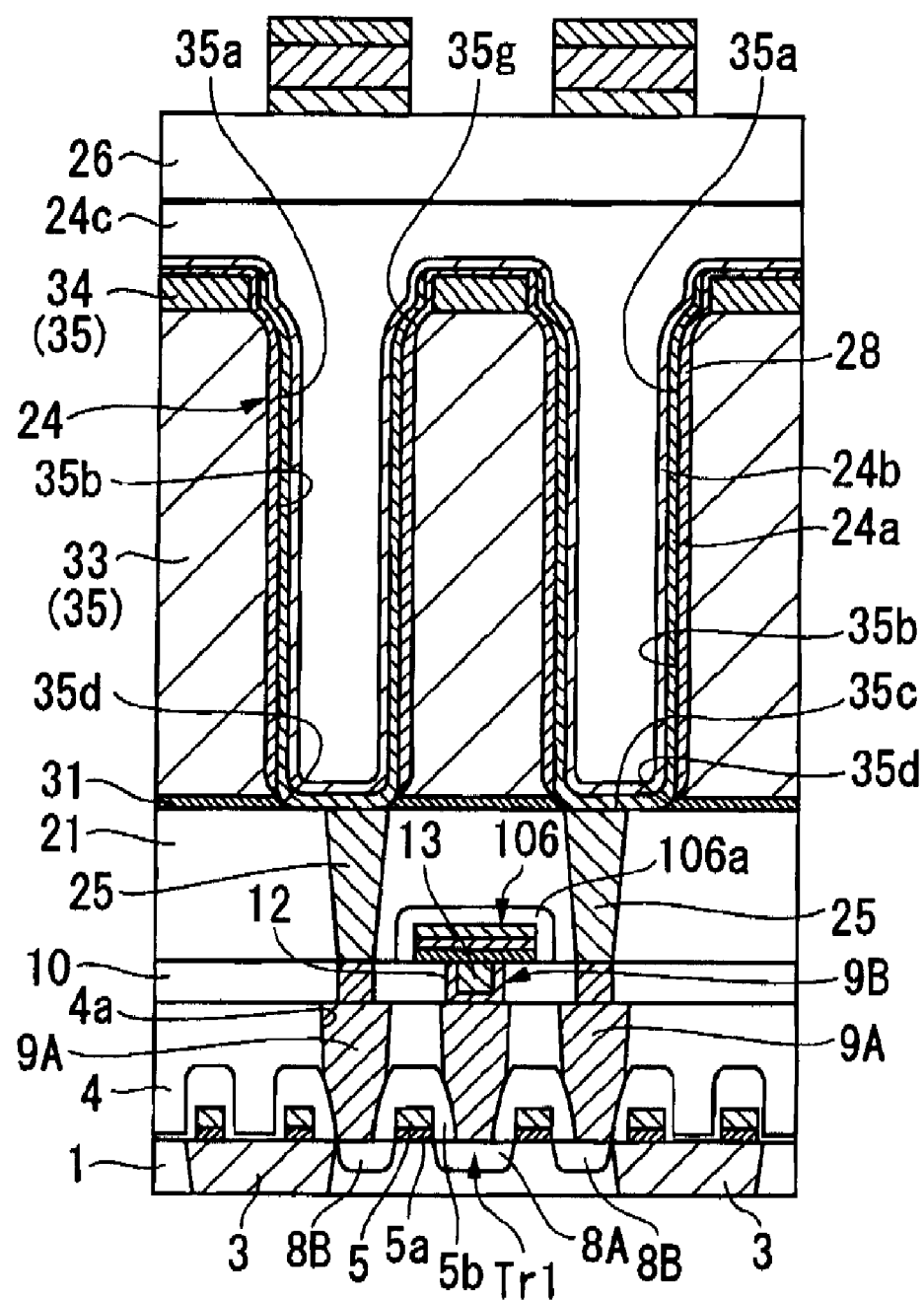
FIG. 10A is a schematic sectional view showing main parts of a memory cell for explaining a process of forming a storage capacity part in a method of manufacturing the semiconductor device according to the first embodiment of the present invention.

Next, as shown in FIG. 10A, at a side of the memory cell, a bottom electrode film 24a of thickness of 10 nm to 20 nm is formed by, for example, a CVD method to cover the inner side of the through-hole 35a including the boundary 35d and the interface 35f. An example of a material of the bottom electrode film 24a may include TiN, WN, Ru, etc.

After forming the bottom electrode film 24a, a dielectric film 24b of a thickness of 7 nm to 10 nm is formed by, for example, an ALD method or a CVD method to cover the bottom electrode film 24a and the silicon nitride insulating film 28 on the silicon oxide film 34. An example of a material of the dielectric film 24b may include $Al_2O_3$, $HfO_2$, $ZrO_2$, or combination layers thereof.

After forming the dielectric film 24b, a top electrode film 24c is formed by a CVD method and a sputtering method to fill the through-hole 35a. That is, the top electrode film 24c is formed by forming a film of a thickness of 10 nm to 20 nm made of TiN, WN or Ru by a CVD method and then forming a film of a thickness of 150 nm or so made of W by a sputtering method.

A conductive film 26 made of tungsten or the like is laminated on the top electrode film 24c and a wiring layer 27 is formed on the conductive film 26.

Figure 10B:
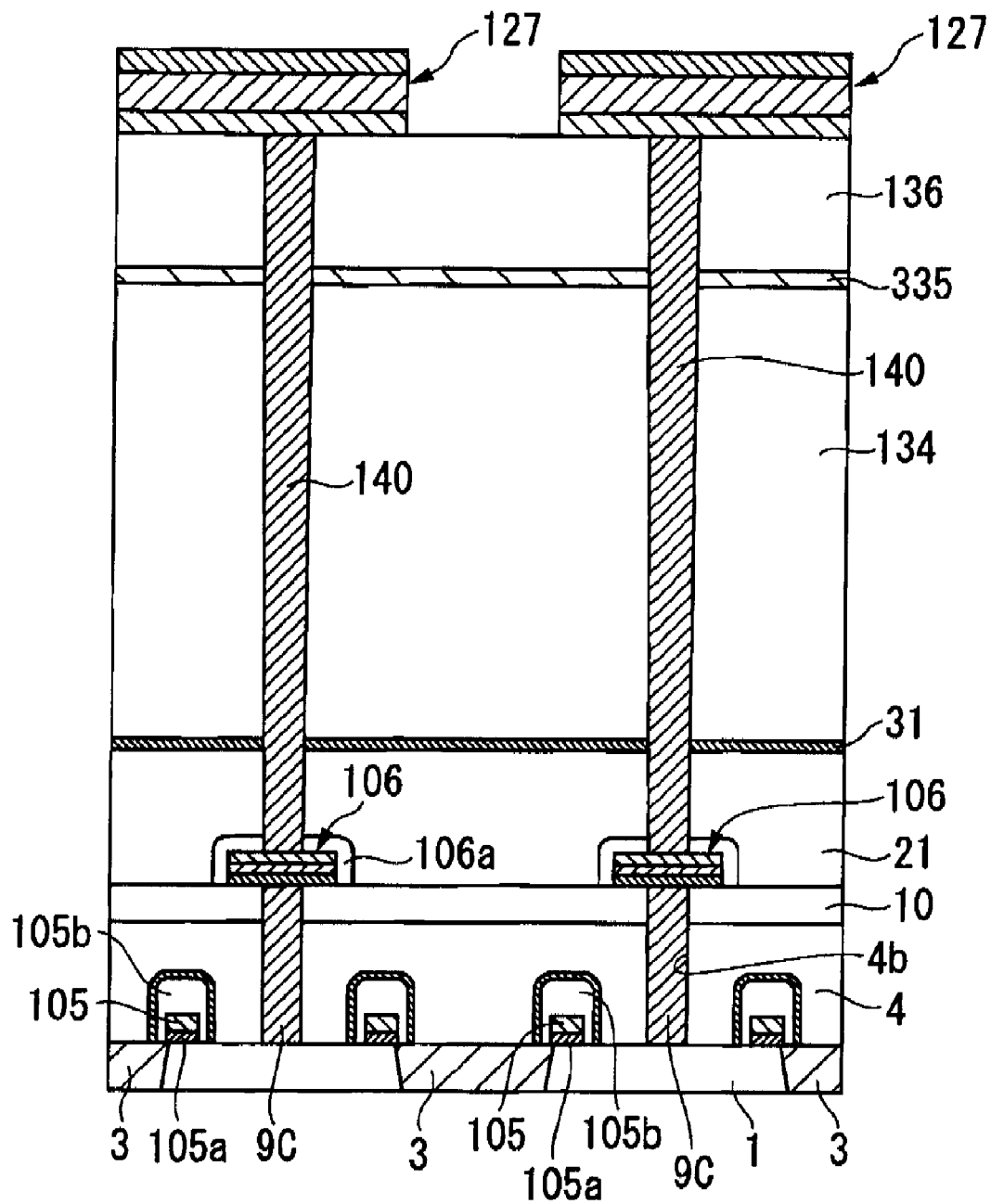
FIG. 10B is a schematic sectional view showing main parts of a peripheral circuit for explaining a process of forming a storage capacity part in a method of manufacturing the semiconductor device according to the first embodiment of the present invention.

In addition, as shown in FIG. 10B, at a side of the peripheral circuit, the fifth interlayer insulating film 136 made of silicon oxide is formed on the second silicon nitride interlayer film 335. The top of the fifth interlayer insulating film 136 is planarized by a CMP method or the like such that the top of the fifth interlayer insulating film 136 has the same level as the top of the conductive film 26 at a side of the memory cell. After forming the fifth interlayer insulating film 136, a contact hole to expose the bit line 106 is formed through the fifth interlayer insulating film 136 up to a portion of the third interlayer insulating film 21 by photography and etching.

Next, the contact hole is filled with polysilicon or the like to form the contact plug 140. Next, the wiring layer 127 is formed on the fifth interlayer insulating film 136.

Through the above process, the semiconductor device of this embodiment is manufactured.

Figure 11:
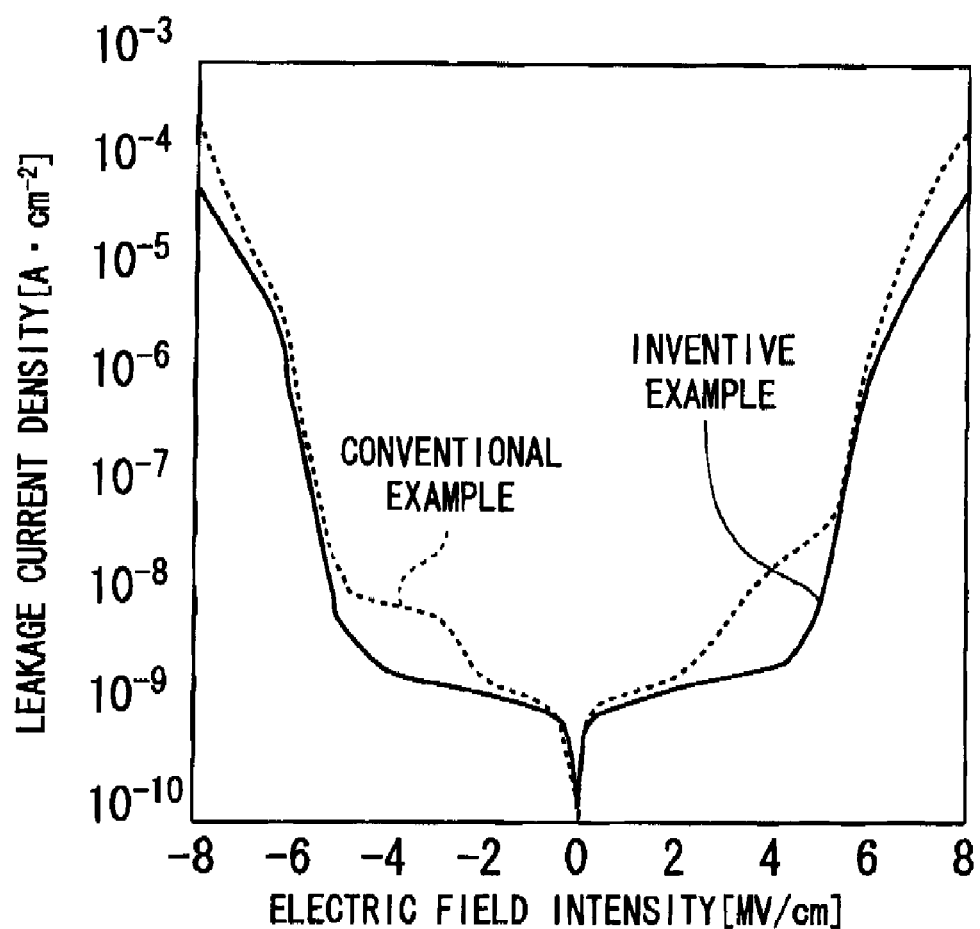
FIG. 11 is a graph showing a relationship between current density and electric field intensity in storage capacity parts in an inventive example and a conventional example.

FIG. 11 is a graph showing a relationship between current density and electric field intensity in storage capacity parts in the semiconductor device manufactured by the method of the present invention and a conventional semiconductor device manufactured in the same way as the method of the present invention except for that annealing in the hydrogen atmosphere or the inert gas atmosphere was omitted. As shown in FIG. 11, the inventive example has a reduced leakage current density and reduced leakage current of the storage capacity part as compared to the conventional example, thereby improving reliability of the semiconductor device.

According to the semiconductor device of the present invention, since the boundary 35d between the bottom 35c and the side wall 35b of the through-hole 35a provided in the polysilicon interlayer film 33 has the curved surface, the storage capacity part 24 is formed into the shape of the inner side of the through-hole 35a having the curved shape. Accordingly, it is possible to reduce leakage current of the storage capacity part 24 as compared to when the boundary between the bottom and the side wall of the through-hole 35a has an angled shape, thereby providing a semiconductor device having high reliability.

That is, as the bottom electrode film 24a, the dielectric film 24b and the top electrode film 24c of the storage capacity part 24 are formed into the shape of the inner side of the through-hole 35a having the curved shape of the boundary 35d, the thickness and film quality of the bottom electrode film 24a, the dielectric film 24b and the top electrode film 24c become uniform, and accordingly, coverage of the bottom electrode film 24a, the dielectric film 24b and the top electrode film 24c for the inner side of the through-hole 35a is improved, thereby reducing leakage current of the storage capacity part 24 and thus providing a semiconductor device having high reliability.

In addition, as the interface 35g between the side wall 35b of the through-hole 35a and the top 33a of the polysilicon interlayer film 33 has the curved surface, leakage current of the storage capacity part 24 is further reduced, thereby providing a semiconductor device having higher reliability.

In addition, according to the semiconductor device of the present invention, since the side wall 35b of the through-hole 35a is covered by the silicon nitride insulating film 28, the insulating property of the storage capacity part 24 can be enhanced, thereby preventing loss of electrostatic capacity. In addition, this insulating film 28 can prevent the constituent material of the storage capacity part 24 from being diffused into the polysilicon interlayer film 33.

In addition, according to the method of manufacturing the semiconductor device of the present invention, in the through-hole forming process, since the boundary 35d between the bottom 35c and the side wall 35b of the through-hole 35a is shaped into the curve, the storage capacity part 24 to be formed later is formed into the shape of the inner side of the through-hole 35a having the curved shape. Accordingly, it is possible to reduce leakage current of the storage capacity part 24 as compared to when the boundary 35d of the through-hole 35a has an angled shape, thereby providing a semiconductor device having high reliability.

In addition, as the interface 35g between the side wall 35b of the through-hole 35a and the top 33a of the polysilicon interlayer film 33 is shaped into the curve, leakage current of the storage capacity part 24 is further reduced, thereby providing a semiconductor device having higher reliability.

In addition, according to the method of manufacturing the semiconductor device of the present invention, in the through-hole forming process, as the polysilicon interlayer film 33 is annealed in the hydrogen atmosphere or the inert gas atmosphere, migration of silicon atoms contained in the polysilicon interlayer film 33 is facilitated, thereby easily shaping the interface 35f of the preliminary through-hole 35e into the curve. Thereafter, by anisotropic-etching the bottom of the preliminary through-hole 35e, the curved shape of the interface 35f remains as the shape of the boundary 35d of the through-hole 35a. By forming the storage capacity part 24 with such a through-hole 35a, the bottom electrode film 24a, the dielectric film 24b and the top electrode film 24c of the storage capacity part 24 are formed at a specified film thickness to cover the entire inner side of the through-hole 35a, thereby reducing leakage current of the storage capacity part 24 and thus providing a semiconductor device having high reliability.

In addition, since the polysilicon interlayer film 33 can be formed with the through-hole 35a having the aspect ratio higher than that of a conventional silicon oxide interlayer film, there is little possibility of short-circuit occurring between adjacent through-holes 35a and hence between storage capacity parts 24. In addition, the formation of the through-hole 3a having the high aspect ratio in the polysilicon interlayer film 33 allows uniform expansion of the through-hole 35a in the diameter direction since an etching rate of the through-hole 35a in the polysilicon interlayer film 33 in the diameter direction is lower than that of the conventional silicon oxide film, thereby avoiding a so-called bowing problem.

In addition, in the through-hole forming process, since the side wall 35b of the through-hole 35a is covered by the silicon nitride insulating film 28, the insulating property of the storage capacity part 24 can be enhanced, thereby preventing loss of electrostatic capacity. In addition, this insulating film 28 can prevent the constituent material of the storage capacity part 24 to be formed later from being diffused into the polysilicon interlayer film.

In addition, by forming the silicon oxide film 34 for anti-oxidation on the polysilicon interlayer film 33, the polysilicon interlayer film 33 is prevented from being oxidized, and volume change caused by oxidation of the polysilicon interlayer film 33 becomes small to maintain the thickness of the polysilicon interlayer film 33. Accordingly, a planarization treatment for the polysilicon interlayer film 33 is not required when a mask or the like is laminated on the polysilicon interlayer film 33, thereby stably performing the through-hole forming process and the storage capacity part forming process.

In addition, by forming the first silicon nitride interlayer film 31 on the polysilicon interlayer film 33 at a side of the semiconductor substrate, the first silicon nitride interlayer film 31 can be used as an etching stopper layer in formation of the through-hole.

(Method of Manufacturing Semiconductor Device of Second Embodiment)

Next, a method of manufacturing the semiconductor device according to a second embodiment will be described.

Figure 12:
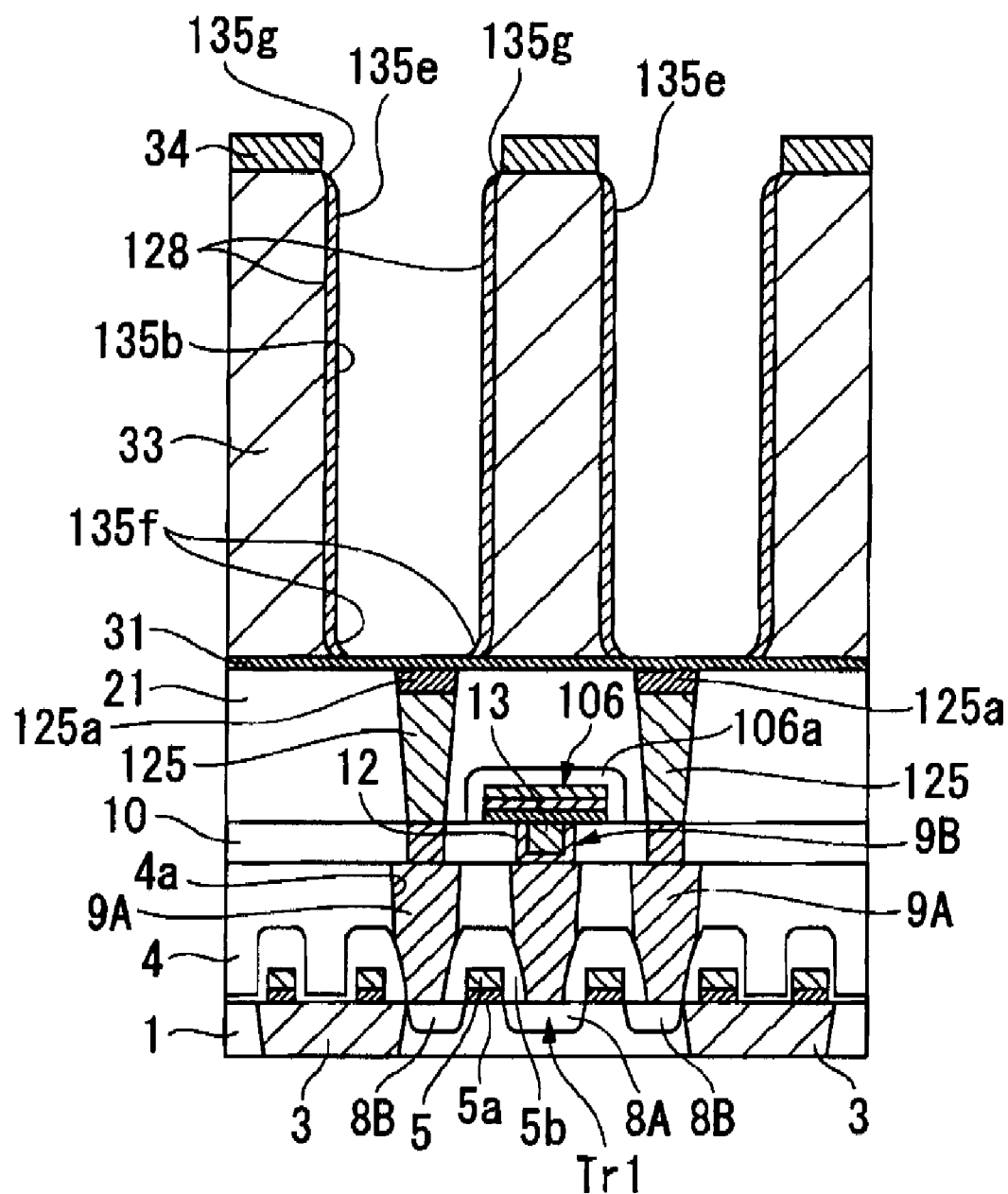
FIG. 12 is a view for explaining a process of forming a through-hole in a method of manufacturing a semiconductor device according to a second embodiment of the present invention.

First, as shown in FIG. 12, in the same way as the method of manufacturing the semiconductor device according to the first embodiment, the first silicon nitride interlayer film 31, the polysilicon interlayer film 33 and the silicon oxide film 34 are laminated on the third interlayer insulating film 21. In addition, in the second embodiment, an example of a material for the capacitive contact plug 125 formed on the third interlayer insulating film 21 may include Ru, Ir, W, or an alloy thereof In this case, in order to prevent the constituent material of the capacitive contact plug 125 from being diffused into the third interlayer insulating film 21, a barrier metal layer made of TiN or the like may be provided at an interface between the capacitive contact plug 125 and the third interlayer insulating film.

In addition, a preliminary through-hole 135e is provided by anisotropic-etching the silicon oxide film 34 and the polysilicon interlayer film 33 using the first silicon nitride interlayer insulating film 31 as an etching stopper. Next, an annealing treatment is carried out in a hydrogen atmosphere or an inert gas atmosphere. As shown in FIG. 12, this annealing causes migration of silicon atoms contained in the polysilicon interlayer film 33, and accordingly, an interface 135f between the side wall 135b of the preliminary through-hole 135e and the first silicon nitride interlayer film 31 is shaped into a curve. At the same time, an interface 135g between the side wall 135b of the preliminary through-hole 135e and the top of the polysilicon interlayer film 33 is also shaped into a curve.

In addition, a portion of the polysilicon interlayer film 33 is exposed in the side wall of the preliminary through-hole 135e. So, a thermal oxidation treatment is carried out for polysilicon. As shown in FIG. 12, by the thermal oxidation treatment, the side wall 135b of the preliminary through-hole 135e is oxidized to form the silicon oxide insulating film 128. The thickness of the silicon oxide insulating film 128 depends on conditions of the thermal oxidation treatment, and is preferably 4 nm to 10 nm, for example.

In addition, with the formation of the silicon oxide insulating film 128 by the thermal oxidation treatment, a portion of the preliminary through-hole 135e of the capacitive contact plug 125 is oxidized to form a metal oxide layer 125a. Although the capacitive contact plug 125 is made of Ru, Ir, W or an alloy thereof, since and oxide of these metal or alloy thereof has low electrical resistance, electrical resistance of the capacitive contact plug will not be increased even in the presence of the metal oxide layer 125a.

Figure 13:
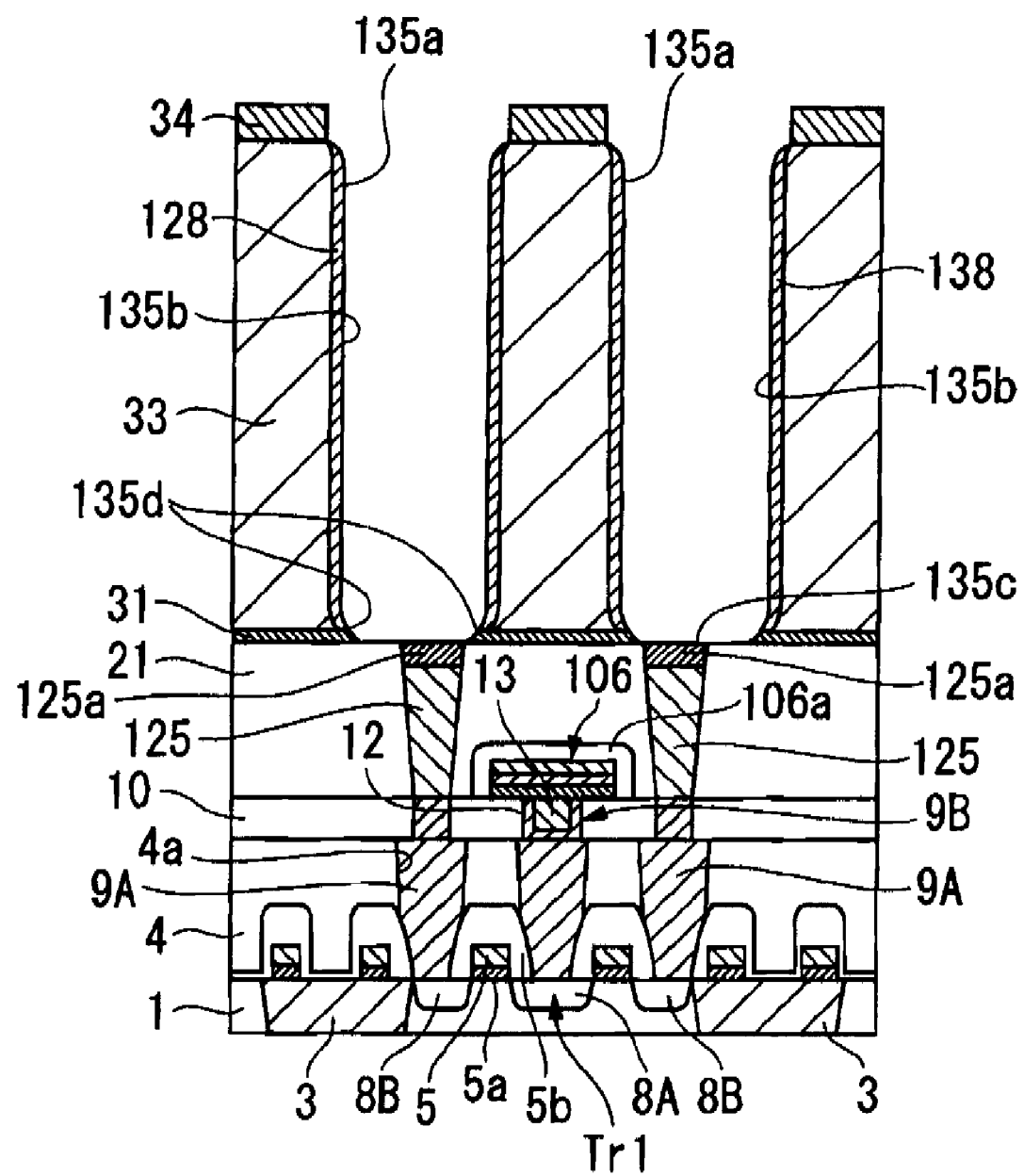
FIG. 13 is a view for explaining a process of forming a through-hole in a method of manufacturing the semiconductor device according to the second embodiment of the present invention.

Next, as shown in FIG. 13, the first silicon nitride interlayer film 31 at the bottom of the preliminary through-hole 135e is removed by anisotropic etching. Accordingly, the metal oxide layer 125a of the capacitive contact plug 125 is exposed. The silicon oxide insulating film 128 formed on the side wall of the preliminary through-hole 135e remains without being etched. In this manner, the through-hole 135a is formed.

In addition, like the first embodiment, the curved shape of the interface 135f in the preliminary through-hole 135e remains unchanged in the anisotropic etching. Accordingly, the boundary 135d between the side wall 135b and the bottom 135c of the through-hole 135a is shaped in a curve corresponding to the shape of the interface 135f.

In this manner, the through-hole 135a having the curved boundary 135d is formed.

Figure 14:
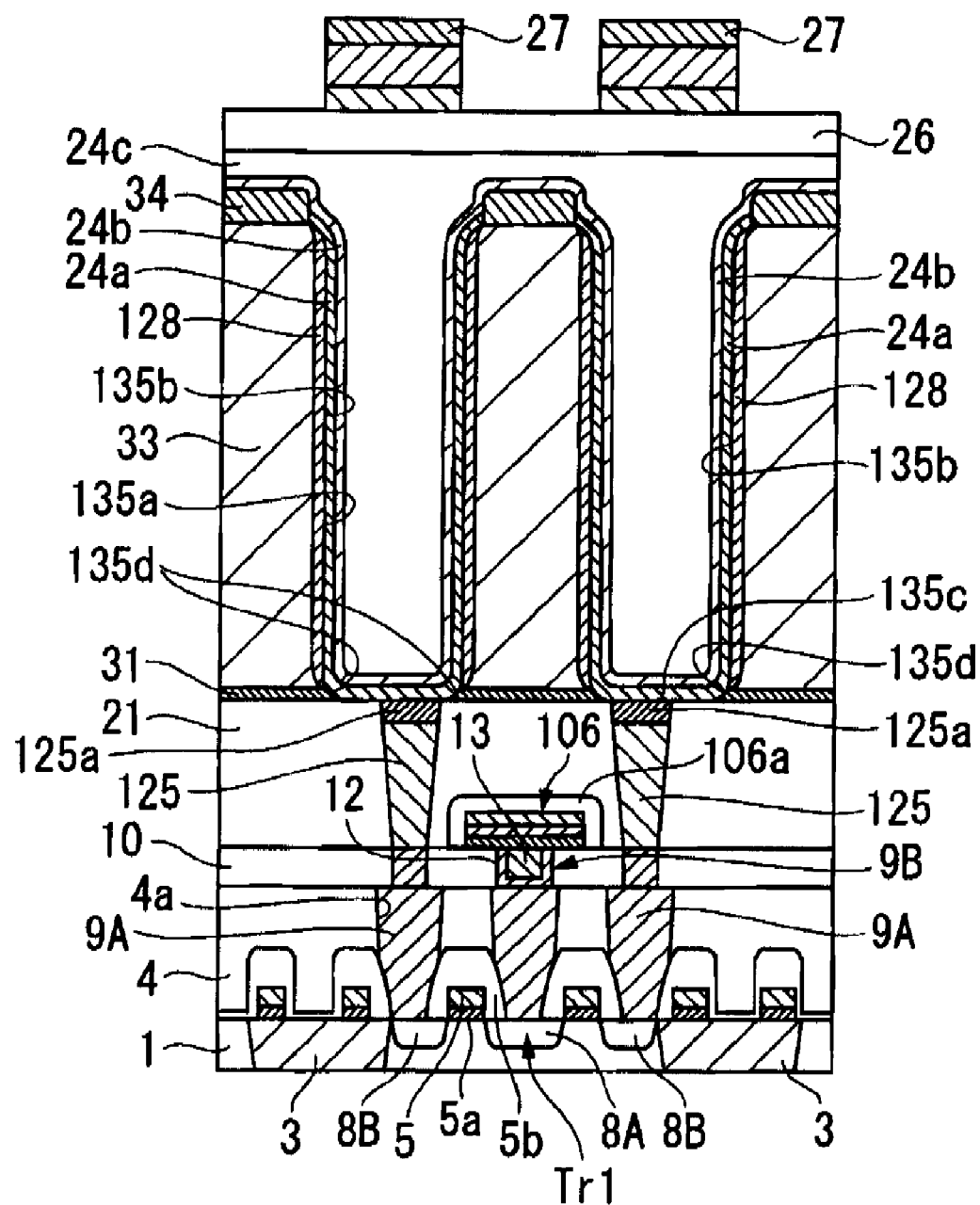
FIG. 14 is a view for explaining a process of forming a storage capacity part in a method of manufacturing the semiconductor device according to the second embodiment of the present invention.

Thereafter, as shown in FIG. 14, in the same way as the earlier-described method of manufacturing the semiconductor device, the bottom electrode film 24a, the dielectric film 24b and the top electrode film 24c are formed in order to form the storage capacity part 24. In addition, the conductive film 26 made of tungsten or the like is laminated on the top electrode film 24c, and the wiring layer 27 is formed on the conductive film 26.

In this manner, the semiconductor device according to the second embodiment is manufactured.

According to the method of manufacturing the semiconductor device according to the second embodiment, the following effects are obtained in addition to the effects obtained in the first embodiment.

That is, according to the method of the second embodiment, since the silicon oxide insulating film 128 formed by the thermal oxidation treatment is provided in the inner side of the through-hole 135a, the insulating property of the storage capacity part 24 can be enhanced, thereby preventing loss of electrostatic capacity. In addition, the silicon oxide insulating film 128 can prevent the constituent material of the storage capacity part 24 from being diffused into the polysilicon interlayer film 33.

There is a possibility of an increase of electrical resistance due to oxidation of the top of the capacitive contact plug 125 when the silicon oxide insulating film 128 is formed by the thermal oxidation treatment. However, in the second embodiment, by using a material without reduction of conductivity even by oxidation, such as Ru, Ir, W or an alloy thereof, as the constituent material of the capacitive contact plug 125, it is possible to prevent an increase of specific resistance of the capacitive contact plug 125 and hence a decrease of electrostatic capacity in the storage capacity part 24.

(Method of Manufacturing Semiconductor Device of Third Embodiment)

Next, a method of manufacturing the semiconductor device according to a third embodiment will be described.

Figure 15:
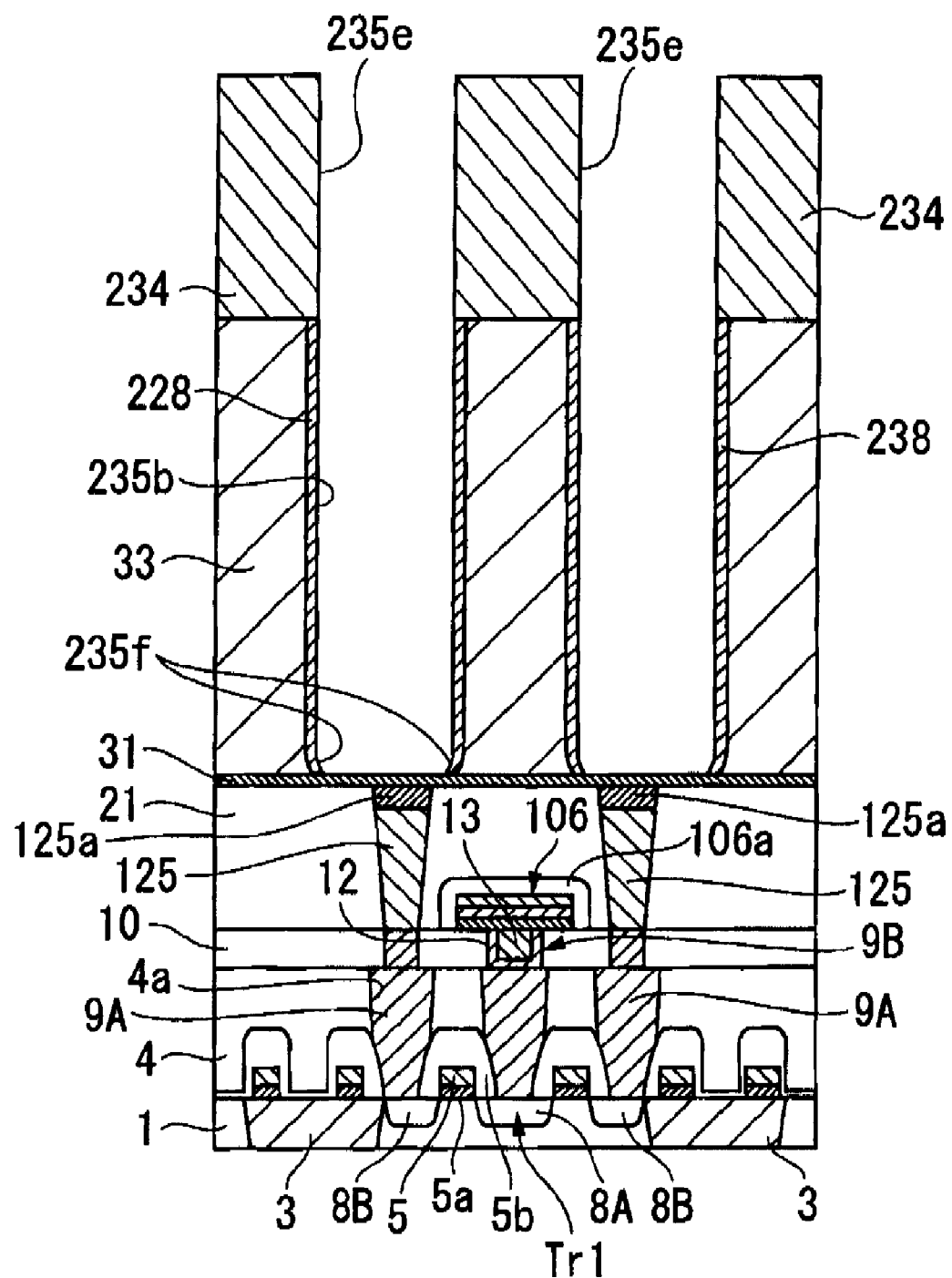
FIG. 15 is a view for explaining a process of forming a through-hole in a method of manufacturing a semiconductor device according to a third embodiment of the present invention.

First, as shown in FIG. 15, in the same way as the method of manufacturing the semiconductor device according to the first embodiment, the first silicon nitride interlayer film 31, the polysilicon interlayer film 33, and a silicon oxide film 234 of thickness of 0.5 to 3 μm are laminated on the third interlayer insulating film 21. In addition, in the third embodiment, like the second embodiment, an example of the material for the capacitive contact plug 125 formed on the third interlayer insulating film 21 may include Ru, Ir, W, or an alloy thereof. In this case, a barrier metal layer made of TiN or the like may be provided at an interface between the capacitive contact plug 125 and the third interlayer insulating film 21.

In addition, a preliminary through-hole 235e is provided by anisotropic-etching the silicon oxide film 234 and the polysilicon interlayer film 33 using the first silicon nitride interlayer insulating film 31 as an etching stopper. Next, an annealing treatment is carried out in a hydrogen atmosphere or an inert gas atmosphere. As shown in FIG. 15, this annealing causes migration of silicon atoms contained in the polysilicon interlayer film 33, and accordingly, an interface 235f between a side wall 235b of the preliminary through-hole 235e and the first silicon nitride interlayer film 31 is shaped into a curve.

In addition, the polysilicon interlayer film 33 is exposed in the side wall of the preliminary through-hole 235e. So, a thermal oxidation treatment is carried out for polysilicon. As shown in FIG. 15, by the thermal oxidation treatment, a portion of the side wall 235b of the preliminary through-hole 235e is oxidized to form a silicon oxide insulating film 228. The thickness of the silicon oxide insulating film 228 depends on conditions of the thermal oxidation treatment, and is preferably 4 nm to 10 nm, for example.

In addition, with the formation of the silicon oxide insulating film 228 by the thermal oxidation treatment, like the second embodiment, a portion of the preliminary through-hole 235e of the capacitive contact plug 125 is oxidized to form a metal oxide layer 125a.

Figure 16:
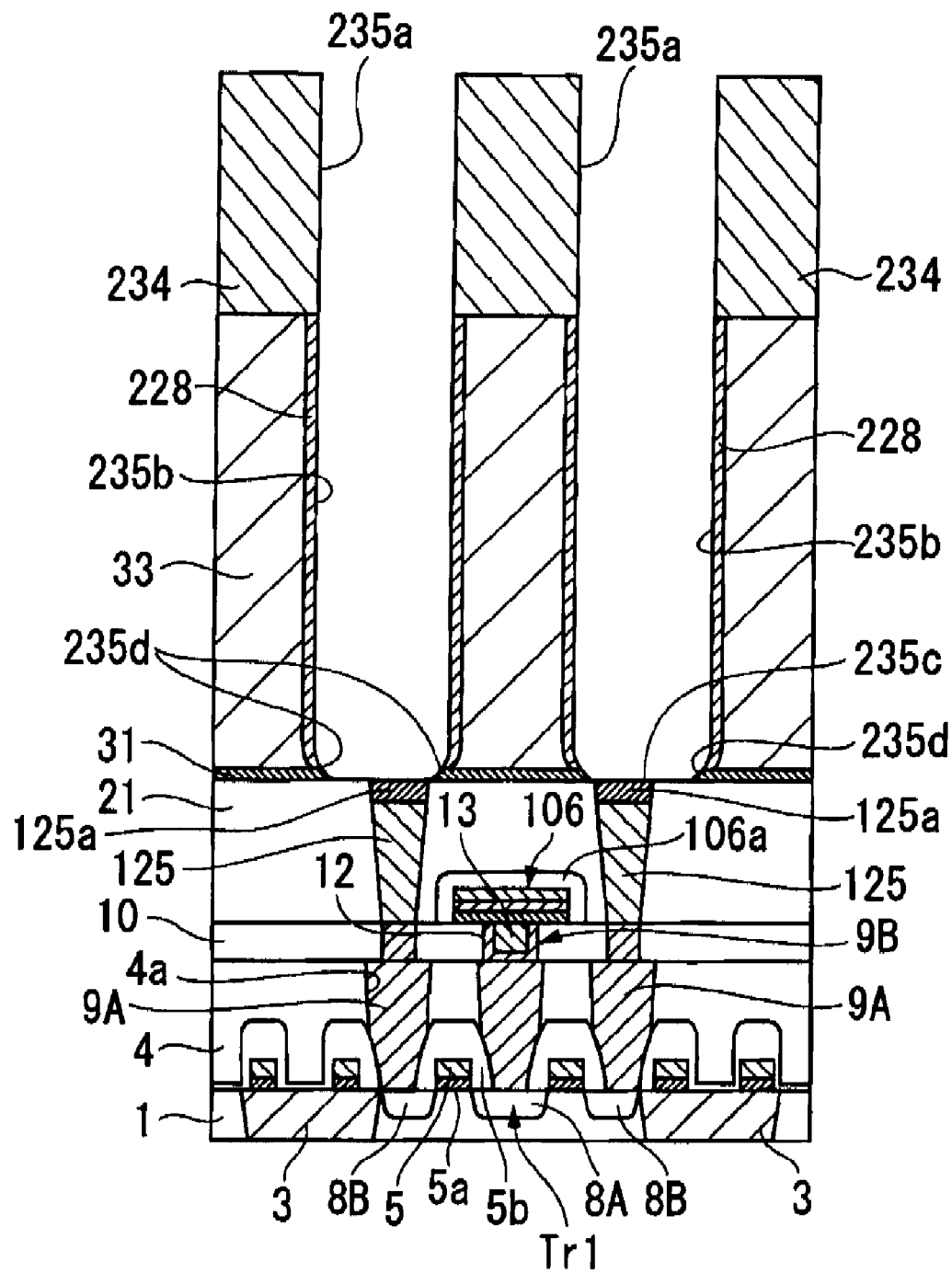
FIG. 16 is a view for explaining a process of forming a through-hole in a method of manufacturing the semiconductor device according to the third embodiment of the present invention.

Next, as shown in FIG. 16, the first silicon nitride interlayer film 31 at the bottom of the preliminary through-hole 235e is removed by anisotropic etching. Accordingly, the metal oxide layer 125a of the capacitive contact plug 125 is exposed. The silicon oxide insulating film 128 formed on the side wall of the preliminary through-hole 235e remains without being etched. In this manner, the through-hole 135a is formed.

In addition, like the first embodiment, the curved shape of the interface 235f in the preliminary through-hole 135e remains unchanged in the anisotropic etching. Accordingly, the boundary 235d between the side wall 235b and the bottom 235c of the through-hole 235a is shaped in a curve corresponding to the shape of the interface 235f.

In this manner, the through-hole 235a having the curved boundary 235d is formed.

Figure 17:
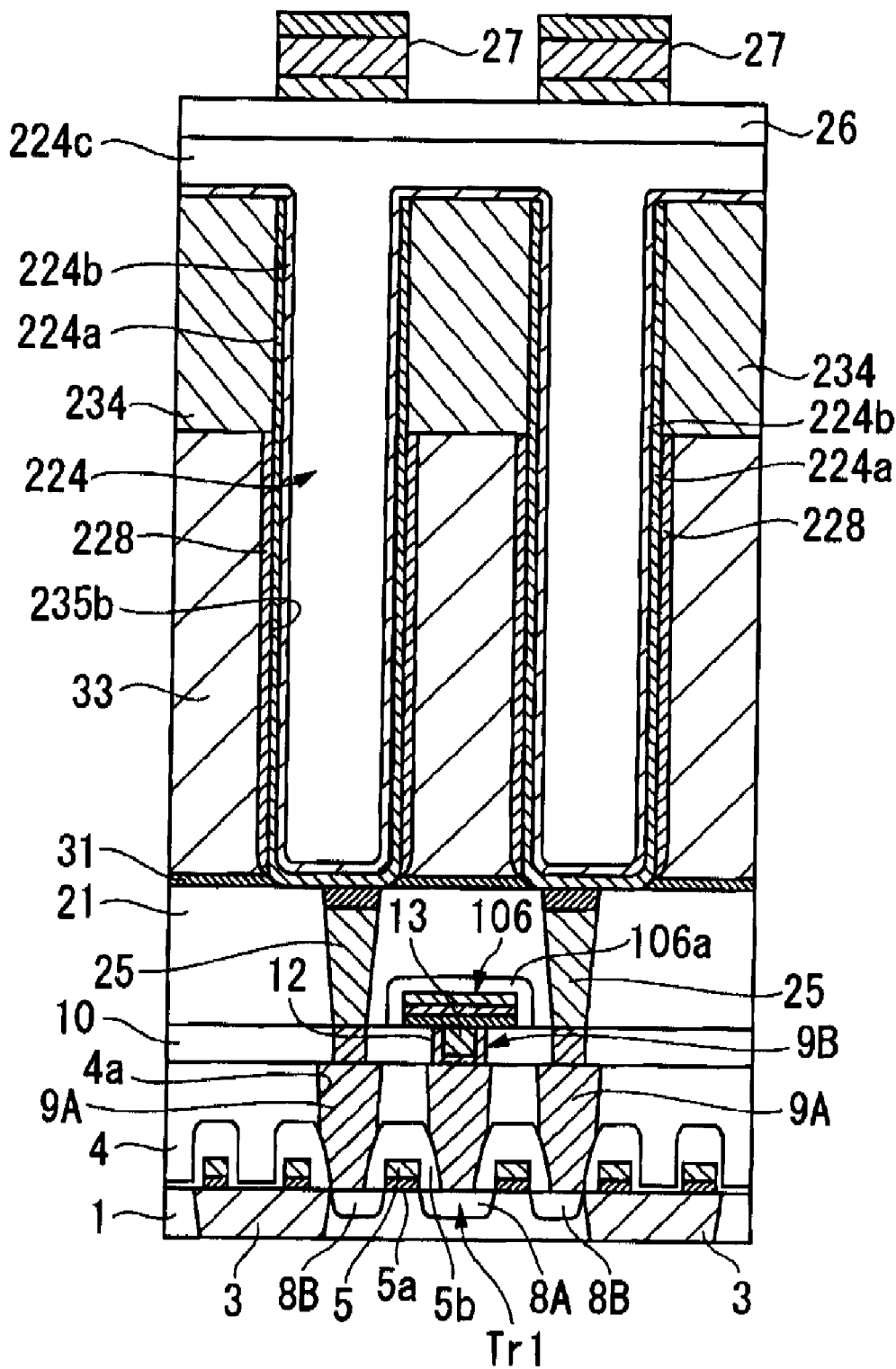
FIG. 17 is a view for explaining a process of forming a storage capacity part in a method of manufacturing the semiconductor device according to the third embodiment of the present invention.

Thereafter, as shown in FIG. 17, in the same way as the earlier-described method of manufacturing the semiconductor device, a bottom electrode film 224a, a dielectric film 224b and a top electrode film 224c are formed in order to form a storage capacity part 224. In addition, the conductive film 26 made of tungsten or the like is laminated on the top electrode film 224c, and the wiring layer 27 is formed on the conductive film 26.

In this manner, the semiconductor device according to the third embodiment is manufactured.

According to the semiconductor device and the method of manufacturing the same according to the third embodiment, the following effects are obtained in addition to the effects obtained in the first and second embodiments.

That is, according to the semiconductor device of the third embodiment, since the silicon oxide film 234 of a thickness of 0.5 μm to 3 μm is laminated on the polysilicon interlayer film 33, the through-hole 235a passing through the silicon oxide film 234 and the polysilicon interlayer film 33 is formed, and the storage capacity part 224 is formed in the through-hole 235a, it is possible to further enlarge an electrode area of the storage capacity part 224 and hence increase electrostatic capacity.

What is claimed is:

1. A method of manufacturing a semiconductor device comprising the steps of:
    forming at least a polysilicon interlayer film above a memory cell selection transistor that is formed on a semiconductor substrate and has a contact plug connected to a source and a drain;
    forming a cylinder-shaped through-hole in the polysilicon interlayer film to expose the contact plug and shaping a boundary surface between a bottom and a side wall of the through-hole into a curve; and
    forming a storage capacity part in the inner side of the through-hole, the storage capacity part being connected to the contact plug,
    wherein, in the step of forming the through-hole, the boundary surface between the bottom and the side wall of the through-hole is shaped in the curve by annealing the polysilicon interlayer film, in a hydrogen atmosphere or in an inert gas atmosphere.

2. The method according to claim 1,
    wherein, in the step of forming the through-hole, the side wall of the through-hole is covered by a silicon nitride insulating film or a silicon oxide insulating film.

3. The method according to claim 2,
    wherein the contact plug includes at least one of Ru, Ir, W or an alloy thereof.

4. A method of manufacturing a semiconductor device, the method comprising:
    forming a contact plug that is connected to one of a source and a drain of a memory cell selection transistor that is formed over a semiconductor substrate;
    forming a first insulating interlayer film that covers a top of the contact plug;
    laminating a polysilicon interlayer film and a second insulating interlayer film over the first insulating interlayer film;
    forming a through-hole that passes through the second insulating interlayer film and the polysilicon interlayer film, so that a top of the first insulating interlayer film is shown through the through-hole;
    annealing the semiconductor substrate in a hydrogen-containing reduction atmosphere to cause migration in the polysilicon interlayer film, thereby causing that a lower portion of the side face of the polysilicon interlayer film is curved toward the center of the through-hole, the lower portion being positioned adjacent to the boundary between the side face of the through-hole and the top of the first insulating interlayer film;
    forming a insulating film that covers a side face of the through-hole;
    removing a portion of the first insulating interlayer film, the portion being in the through-hole, so that the top of the contact plug is shown through the through-hole;
    forming a bottom electrode film of a storage capacitor in the through-hole, the bottom electrode film having a bottom which is connected to the top of the contact plug and a side face which is separated from the polysilicon interlayer film by the insulating film, the insulating film covering the side face of the through-hole, the side face of the bottom electrode film having a lower portion connected to the bottom of the bottom electrode film, the lower portion being curved along the curved lower portion of the side face of the polysilicon interlayer film;
    forming a dielectric film that covers a surface of the bottom electrode film; and
    forming a top electrode film, at least a part of the top electrode film being provided in the through-hole, the top electrode film being separated from the bottom electrode film by the dielectric film.

5. The method according to claim 4, wherein forming the insulating film that covers the side face of the through-hole comprises covering the side face of the through-hole with one of a silicon nitride insulating film and a silicon oxide insulating film.

6. The method according to claim 4, wherein the side face of the through-hole is covered by a silicon insulating film by a thermal oxidation treatment, and the contact plug is formed by at least one of Ru, Ir, W and an alloy thereof.

7. The method according to one of claims 4 to 6, wherein, the first insulating interlayer film comprises a silicon nitride interlayer film, and the second insulating interlayer film comprises a silicon oxide interlayer film.

8. The method according to claim 7, wherein, instead of annealing in a hydrogen atmosphere, annealing in an inert gas atmosphere at a temperature from 800° C. to 1100° C.

* * * * *